(12) United States Patent
Xiu et al.

(10) Patent No.: US 11,157,821 B2
(45) Date of Patent: Oct. 26, 2021

(54) TRACEABILITY SYSTEM AND METHOD FOR TRACEABILITY

(71) Applicant: Hitachi, Ltd., Tokyo (JP)

(72) Inventors: Qi Xiu, Tokyo (JP); Yoshiko Nagasaka, Tokyo (JP); Keiro Muro, Tokyo (JP); Hiromitsu Nakagawa, Tokyo (JP)

(73) Assignee: HITACHI, LTD., Tokyo (JP)

( * ) Notice: Subject to any disclaimer, the term of this patent is extended or adjusted under 35 U.S.C. 154(b) by 803 days.

(21) Appl. No.: 15/993,644

(22) Filed: May 31, 2018

(65) Prior Publication Data

US 2018/0349780 A1   Dec. 6, 2018

(30) Foreign Application Priority Data

Jun. 1, 2017   (JP) .............................. JP2017-109062

(51) Int. Cl.
  *G06N 5/04*   (2006.01)
  *G06Q 10/06*   (2012.01)
  (Continued)

(52) U.S. Cl.
  CPC ............... *G06N 5/04* (2013.01); *G06F 30/20* (2020.01); *G06Q 10/00* (2013.01);
  (Continued)

(58) Field of Classification Search
  None
  See application file for complete search history.

(56) References Cited

U.S. PATENT DOCUMENTS

| 7,647,130 B2 | 1/2010 | Fischer et al. |
| 2005/0246045 A1 | 11/2005 | Sugihara et al. |

(Continued)

FOREIGN PATENT DOCUMENTS

| JP | 09-102056 A | 4/1997 |
| JP | 2005-228128 A | 8/2005 |

(Continued)

OTHER PUBLICATIONS

Zhu, et al., The development of a novel process planning algorithm for an unconstrained hybrid manufacturing process, Journal of Manufacturing Processes 15, 2013, pp. 404-413 (Year: 2013).*

(Continued)

*Primary Examiner* — Wilbert L Starks

(74) *Attorney, Agent, or Firm* — Mattingly & Malur, PC

(57) ABSTRACT

A traceability system includes: a Equipment table that stores production data of a product manufactured in a first process, in which an individual ID is appended to a product; a Equipment table that stores production data of a product manufactured in a second process, in which an individual ID is not appended to a product; a training data setting unit that creates a training data table that stores the Equipment table and the Equipment table, which are correlated with each other; a feature amount extracting unit that calculates a cycle time of a predetermined number of products manufactured in the past in the first process; a model creation section that creates a production time estimation model for estimating a (Continued)

production time at which a product has been manufactured in the second process on the basis of the cycle time of the products; and a production time estimating unit.

11 Claims, 24 Drawing Sheets

(51) Int. Cl.
*G06Q 10/00* (2012.01)
*G06F 30/20* (2020.01)
*G06N 20/00* (2019.01)

(52) U.S. Cl.
CPC ... *G06Q 10/0639* (2013.01); *G06Q 10/06395* (2013.01); *G06N 20/00* (2019.01)

(56) References Cited

U.S. PATENT DOCUMENTS

| | | |
|---|---|---|
| 2007/0038675 A1 | 2/2007 | Mochizuki et al. |
| 2008/0167747 A1 | 7/2008 | Nakamura |
| 2015/0153730 A1 | 6/2015 | Nishimura et al. |
| 2016/0005298 A1 | 1/2016 | Takahashi et al. |
| 2018/0004194 A1 | 1/2018 | Nishimura et al. |

FOREIGN PATENT DOCUMENTS

| | | |
|---|---|---|
| JP | 2005-339498 A | 12/2005 |
| JP | 2005-346460 A | 12/2005 |
| JP | 2007-011851 A | 1/2007 |
| JP | 2007-025938 A | 2/2007 |
| JP | 2015-108905 A | 6/2015 |
| JP | 2017-109062 A | 6/2015 |
| JP | 2016-14992 A | 1/2016 |

OTHER PUBLICATIONS

Zhu, et al., Application of a hybrid process for high precision manufacture of difficult to machine prismatic parts, International Journal of Advanced Manufacturing Technology, vol. 74, No. 5-8, 2014, pp. 1115-1132 (Year: 2014).*
Japanese Office Action received in corresponding Japanese Application No. 2017-109062 dated Jan. 19, 2021.
Japanese Office Action received in corresponding Japanese Application No. 2017-109062 dated Aug. 31, 2021.

* cited by examiner

| 531 | 532 | 533 | 534 | 535 |

| Record No. | Individual ID | Equipment No. | Production ending time | Concentricity [ø] |
|---|---|---|---|---|
| 000001 | Y000001 | SMON | 16/09/10/00:33:25 | 0.44 |
| 000002 | Y000002 | SMON | 16/09/10/00:34:16 | 0.49 |
| ... | ... | ... | ... | ... |
| 010001 | Y010001 | SMON | 16/11/25/00:32:52 | 0.35 |
| 010002 | Y010002 | SMON | 16/11/25/00:33:48 | 0.46 |
| ... | ... | ... | ... | ... |
| 010125 | Y010125 | SMON | 16/11/25/23:58:09 | 0.49 |

FIG. 10

| Individual ID | Equipment number of Second process | Equipment number of First process | Inter-process lead time [S] |
|---|---|---|---|
| Y010001 | SM01 | SM02 | 672 |
| Y010002 | SM01 | SM02 | 737 |
| ... | ... | ... | ... |
| Y010125 | SM01 | SM02 | 670 |

| Equipment number of First process (571) | Individual ID (572) | Cycle time 1 (573) | Cycle time 2 (574) | ... | Cycle time 30 (575) | Inter-process lead time [S] (576) |
|---|---|---|---|---|---|---|
| SM02 | Y010030 | 127 | 121 | ... | 124 | 712 |
| SM02 | Y010031 | 121 | 119 | ... | 116 | 690 |
| ... | ... | ... | ... | ... | ... | ... |
| SM02 | Y010124 | 118 | 125 | ... | 120 | 744 |
| SM02 | Y010125 | 125 | 122 | ... | 117 | 670 |

| Equipment number of Second process (551) | Second process record No. (552) | Equipment number of First process (553) | First process record No. (554) | No. of inter-process partially finished products (555) |
|---|---|---|---|---|
| SM01 | 010001 | SM02 | 010001 | 2 |
| SM01 | 010002 | SM02 | 010002 | 2 |
| SM01 | 010003 | SM02 | 010003 | 3 |
| ... | ... | ... | ... | ... |
| SM01 | 010125 | SM02 | 010125 | 4 |

FIG. 19

| Equipment number of first process | Individual ID | Cycle time 1 | Cycle time 2 | ... | Cycle time 30 | Inter-process lead time [S] | No. of inter-process partially finished products |
|---|---|---|---|---|---|---|---|
| SM02 | Y010030 | 127 | 121 | ... | 124 | 712 | 3 |
| SM02 | Y010031 | 121 | 119 | ... | 116 | 690 | 4 |
| ... | ... | ... | ... | ... | ... | ... | ... |
| SM02 | Y010124 | 118 | 125 | ... | 120 | 744 | 2 |
| SM02 | Y010125 | 125 | 122 | ... | 117 | 670 | 3 |

TRACEABILITY SYSTEM AND METHOD FOR TRACEABILITY

BACKGROUND

The present invention relates to a traceability system and a method for traceability.

In order to improve the quality of products, data (production data) related to production of products is output in each production process of a production plant. In a production plant, pieces of the output production data are associated with each other and are analyzed so that the causes of defects and countermeasures thereof can be identified.

Conventionally, in each production process, a unique identification number is assigned to each product, the production data of a defective product is acquired from the identification number, and the causes of defects are analyzed.

Here, if the production process includes a sintering process, a cutting process, or the like, since a unique identification number assigned to a product will be melt down or cut in these processes, and this hampers appending a unique identification number to a product.

If a production process includes a process that hampers appending a unique identification number, production processes preceding the same do not include a process of appending a unique identification number to a product. Therefore, there is a problem in that production data necessary for analyzing the causes of defects cannot be acquired.

Therefore, a method of calculating an average value of a production time (CT: Cycle Time) of products in a production process in which a unique identification number is not appended to a product and estimating a production time of a defective product from the average value of the cycle time and the number of products manufactured by the production process is disclosed (Japanese Patent Application Publication No. 2015-108905).

SUMMARY

However, in the method disclosed in Japanese Patent Application Publication No. 2015-108905, when the order in which products are manufactured is changed or an actual cycle time becomes longer than an average value due to adjustment or the like of a production process (a production device), it is not possible to estimate a production time of a defective product accurately.

Therefore, the present invention has been made in view of the above-described problems and an object thereof is to estimate a production time of a product accurately in a production process in which a unique identification number is not appended to a product.

In order to solve the problems, a traceability system is provided that estimates a production time at which a product has been manufactured by a predetermined production device, the product being manufactured sequentially by a plurality of production devices, and that identifies production data of the product manufactured by the predetermined production device on the basis of the estimated production time. The traceability system includes: a first production table configured to store production data of products manufactured by a first production device, in which a unique identification number is appended to the product, among the plurality of production devices; a second production table configured to store production data of products manufactured by a second production device, in which a unique identification number is not appended to the product, among the plurality of production devices; a training data setting unit configured to create a training data table that stores the production data of the first production table and the production data of the second production table, which are correlated with each other; a production time calculating unit configured to calculate a cycle time (CT) for each of a predetermined number of products manufactured in the past by the first production device on the basis of the first production table; a model creation section configured to create a production time estimation model for estimating a production time of the product manufactured by the second production device; and a production time estimating unit configured to estimate the production time of the product manufactured by the second production device from the cycle time per one product and the production time estimation model.

According to the traceability system of the present invention, the production time of a product manufactured by the second production device in which a unique identification number is not appended to a product is estimated on the basis of the cycle time of a product manufactured by the first production device in which a unique identification number is appended to a product and the production time estimation model created by the model creation section. Therefore, since the traceability system estimates the production time on the basis of the cycle time of a product and the production time estimation model, it is possible to estimate the production time of a product manufactured by the second production device more accurately.

BRIEF DESCRIPTION OF THE DRAWINGS

FIG. 7 is a diagram illustrating an example of a Equipment SM0N table.

FIG. 10 is a diagram illustrating an example of an inter-process lead time table.

FIG. 11 is a diagram illustrating an example of a feature table.

FIG. 18 is a diagram illustrating an example of a training data table according to a second embodiment.

FIG. 19 is a diagram illustrating an example of a feature table according to the second embodiment.

DETAILED DESCRIPTION OF THE EMBODIMENT

Traceability System

Hereinafter, a traceability system 1 according to an embodiment of the present invention will be described.

Figure 1:
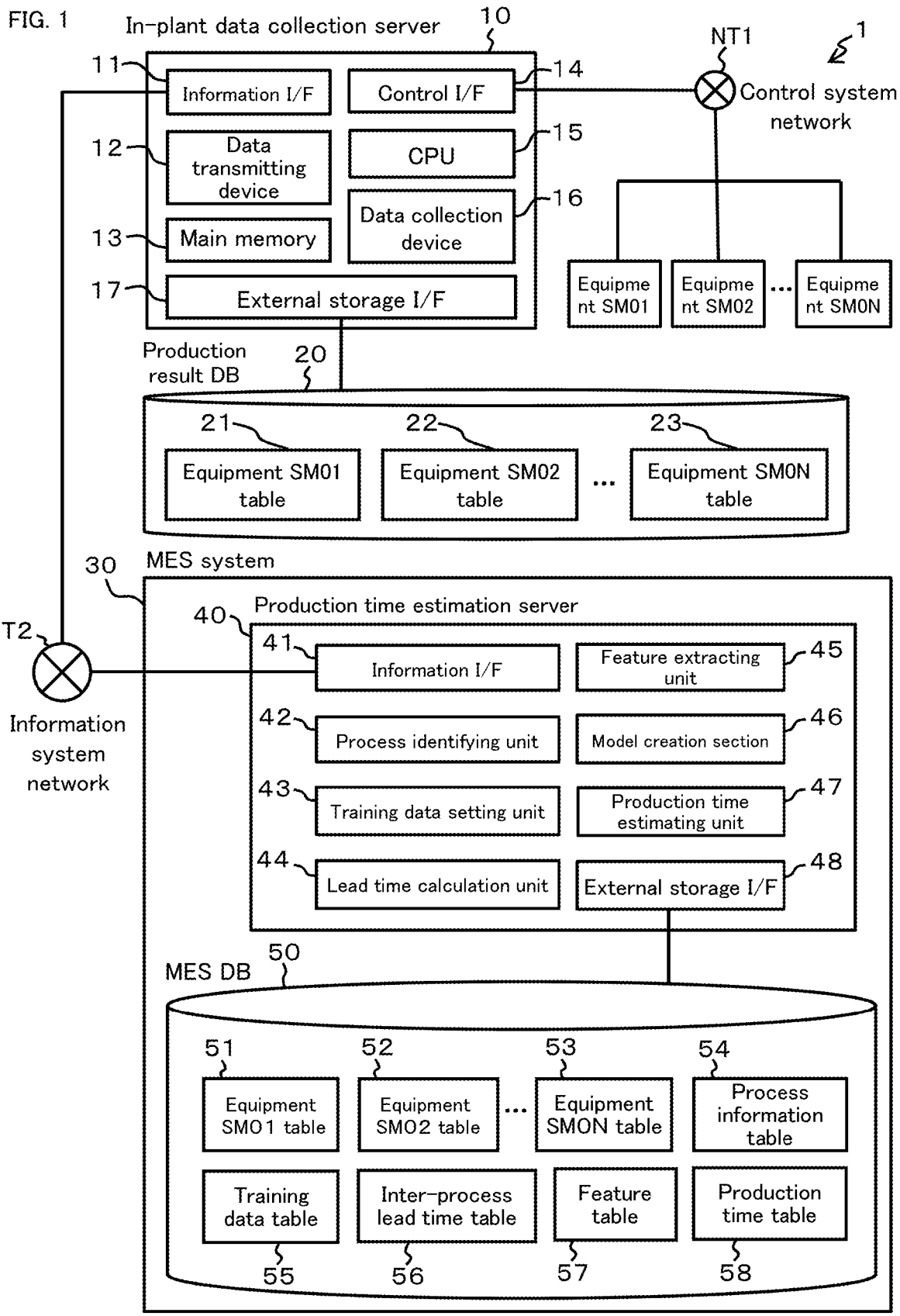
FIG. 1 is a block diagram illustrating a traceability system according to an embodiment.

FIG. 1 is a diagram illustrating a traceability system 1 according to an embodiment.

As illustrated in FIG. 1, the traceability system 1 includes an in-plant data collection server 10, a production result database 20, and a MES system 30.

The in-plant data collection server 10 is connected to respective production Equipment (Equipment SM01, Equipment SM02, . . . , and Equipment SM0N) provided in a production plant via a control system network NT1 and collects information (hereinafter also referred to as production data) on a production result of products manufactured by the respective production equipment.

The in-plant data collection server 10 is connected to a MES system (Production Execution System) 30 via an information system network NT2 and can exchange various pieces of information with the MES system 30.

The control system network NT1 and the information system network NT2 may employ a cable or wireless LAN (Local Area Network).

The equipment SM01, SM02, . . . , and SM0N are connected to the control system network NT1. The equipment SM01, SM02, . . . , and SM0N are connected to the in-plant data collection server 10 via the control system network NT1.

In an embodiment, the Equipment SM01 is a Equipment in which a unique identification number (hereinafter also referred to as an individual ID) cannot be appended to a product. For example, the Equipment SM01 is a forging device, a sintering device, a cutting device, or the like.

The equipment SM02 and SM0N are equipment in which an individual ID can be appended to a product. For example, the equipment SM02 and SM0N are an assembling device, an inspection device, or the like.

In these production equipment (the equipment SM01, SM02, . . . , and SM0N), pieces of production data of a product manufactured by the production equipment are acquired, and these pieces of production data are transmitted to the in-plant data collection server 10 via the control system network NT1.

In the present specification, the Equipment SM01 in which an individual ID is not appended to a product is also referred to as a second process, and the equipment SM02 and SM0N in which an individual ID is appended to a product are also referred to as a first process.

In-Plant Data Collection Server

The in-plant data collection server 10 includes an information I/F 11, a data transmitting device 12, a main memory 13, a control I/F 14, a CPU 15, a data collection device 16, and an external storage I/F 17.

The information I/F (Interface) 11 is an interface that enables information to be exchanged with an external device. The information I/F 11 is connected to the MES system 30 via the information system network NT2 and is also connected to the data transmitting device 12.

The data transmitting device 12 is a device that transmits pieces of production data of products received from the respective production equipment (the equipment SM01, SM02, . . . , and SM0N) to the information I/F 11.

In this way, the production data transmitted from the data transmitting device 12 is transmitted to the MES system 30 via the information I/F 11 and the information system network NT2.

The main memory 13 is a nonvolatile storage device in which a control program or the like for controlling the entire in-plant data collection server 10 is stored.

The control I/F (Interface) 14 is an interface that enables information to be exchanged with an external device. The control I/F 14 is connected to the respective production equipment (equipment SM01, SM02, . . . , and SM0N) provided in the production plant via the control system network NT1 and receives production data of products manufactured by the respective production equipment.

The CPU (Central Processing Unit) 15 reads a control program stored in the main memory 13 to control the entire in-plant data collection server 10.

The data collection device 16 is connected to the control I/F 14 and collects the production data of products manufactured by the respective production equipment (equipment SM01, SM02, . . . , and SM0N), received via the control I/F 14. Moreover, the data collection device 16 is connected to the external storage I/F 17.

The external storage I/F (Interface) 17 is an interface that enables information to be exchanged with an external device and is connected to a production result DB (Database) 20.

The production data of products manufactured by the respective production equipment (equipment SM01, SM02, . . . , and SM0N) is stored in the production result DB 20 via the external storage I/F 17.

Production Result DB

Next, the production result DB 20 will be described.

The production result DB 20 includes Equipment tables (Equipment SM01 table 21, Equipment SM02 table 22, . . . , and Equipment SM0N table 23) that store the production data of products manufactured by the respective production equipment (equipment SM01, SM02, . . . , and SM0N), respectively.

Figure 3:
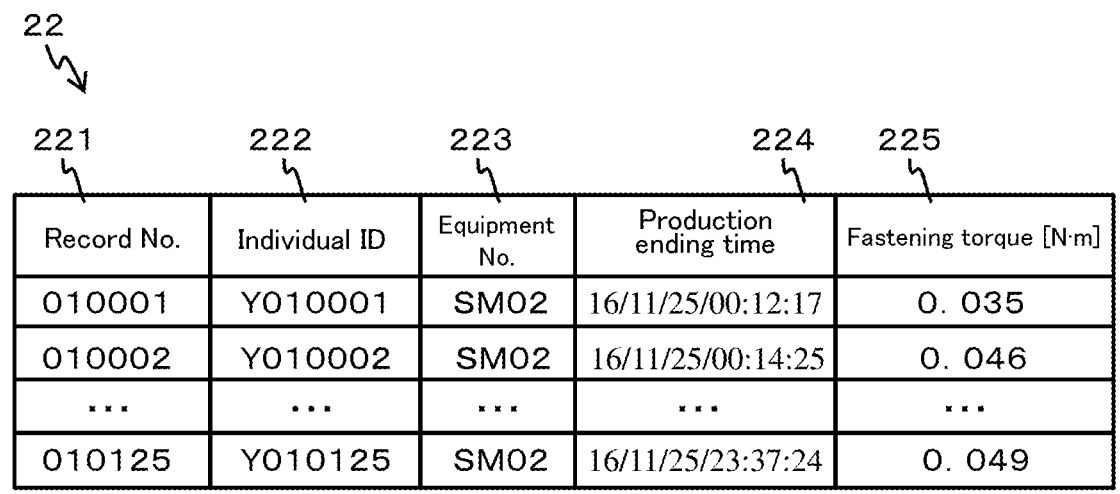
FIG. 3 is a diagram illustrating an example of a Equipment SM02 table.
Figure 4:
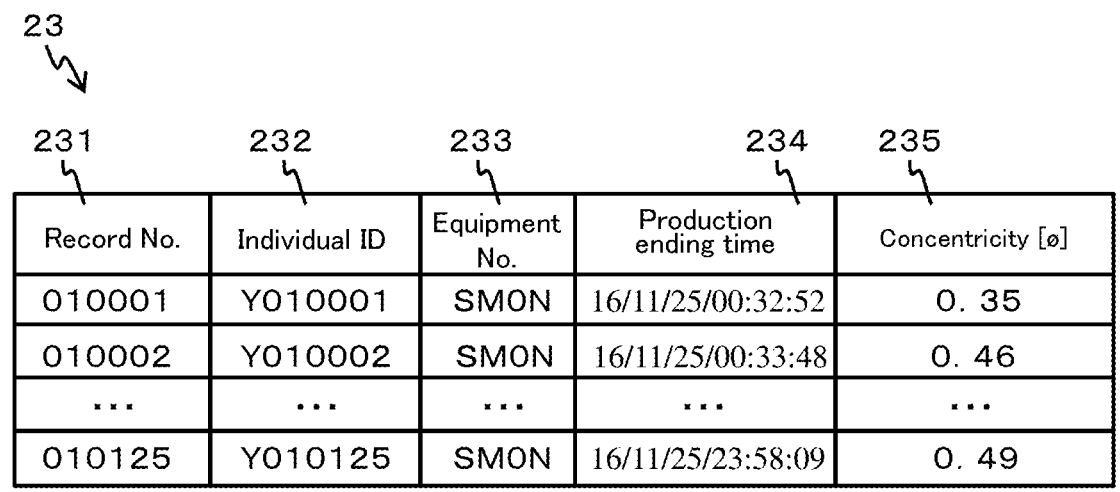
FIG. 4 is a diagram illustrating an example of a Equipment SM0N table.

The production data of products manufactured by the Equipment SM01 is stored in the Equipment SM01 table 21 (see FIG. 2), the production data of products manufactured by the Equipment SM02 is stored in the Equipment SM02 table 22 (see FIG. 3), and the production data of products manufactured by the Equipment SM0N is stored in the Equipment SM0N table 23 (see FIG. 4).

In order to save a memory volume required for storing the production result DB 21, approximately one week of production data of products is stored in the Equipment SM01 table 21, the Equipment SM02 table 22, and the Equipment SM0N table 23, for example. In this way, it is possible to reduce the size of the production result DB 21 and decrease Equipment costs and maintenance costs.

Next, examples of the Equipment SM01 table 21, the Equipment SM02 table 22, and the Equipment SM0N table 23 will be described.

Equipment SM01 Table

Figure 2:
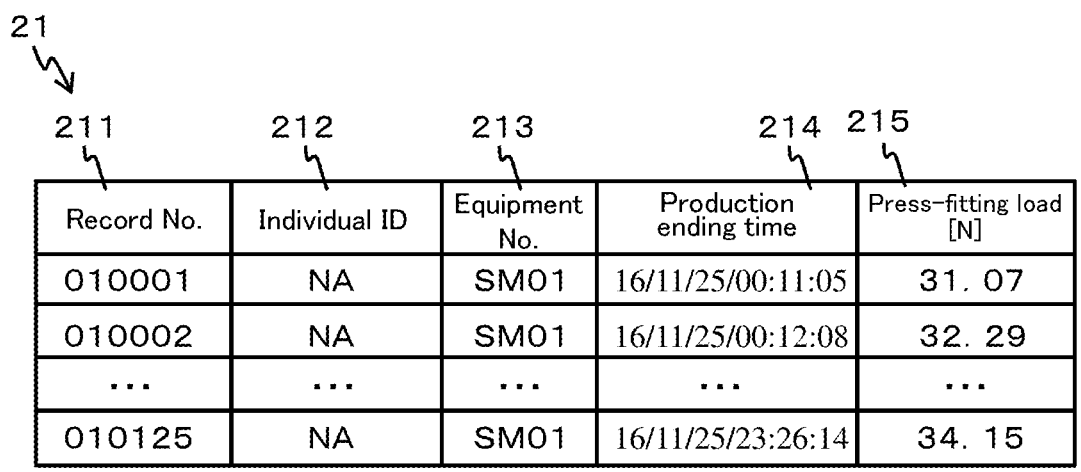
FIG. 2 is a diagram illustrating an example of a Equipment SM01 table.

FIG. 2 is a diagram illustrating an example of the Equipment SM01 table 21.

As illustrated in FIG. 2, a record number 211, an individual ID 212, a Equipment number 213, a production ending time 214, and a press-fitting load 215 are stored in the Equipment SM01 table 21 as the production data of products manufactured by the Equipment SM01.

A number indicating a row allocated to a product for each order of being loaded into the Equipment SM01 is stored in the record number 211. For example, when 125 products are loaded into the Equipment SM01, numerical characters "010001 to 010125" are sequentially allocated to the record number 211.

A unique identification number appended to identify individual products manufactured by the Equipment SM01 is stored in the individual ID 212. In an embodiment, since the Equipment SM01 is a production Equipment (for example, a forging device) in which an individual ID is not appended, "NA (Not Applicable)" is stored in the individual ID 212.

The Equipment number 213 is the number of a Equipment in which a product is loaded. In an embodiment, the number "SM01" of the Equipment SM01 is stored in the Equipment number 213.

A time at which production (machining, assembling, inspection, or the like) of a product loaded to a Equipment ends is stored in the production ending time 214.

In an embodiment, for example, the year "16", the month "11", the day "21", and the time "00:11:05" of production are stored in the production ending time of a product corresponding to the record number "010001". Due to this, the product corresponding to the record number "010001" indicates that the product was manufactured at 00:11:05 on Nov. 21, 2016.

The press-fitting load 215 is a press-fitting load applied to a product in the Equipment SM01 such as a forging device. In an embodiment, the product corresponding to the record number "010001" indicates that the product was manufactured with a press-fitting load of 31.07 N in the Equipment SM01.

Equipment SM02 Table

FIG. 3 is a diagram illustrating an example of the Equipment SM02 table 22.

As illustrated in FIG. 3, a record number 221, an individual ID 222, a Equipment number 223, a production ending time 224, and a fastening torque 225 are stored in the Equipment SM02 table 22 as the production data of products manufactured by the Equipment SM02. Since the Equipment SM02 table 22 has a similar configuration to the Equipment SM01 table 21, differences will be mainly described.

Since the Equipment SM02 is a production Equipment (for example, an assembling device) in which an individual ID is appended to each of loaded products, individual IDs (for example, "Y010001" to "Y010125") of products assembled by the Equipment SM02 are stored in the individual ID 222.

The number "SM02" of the Equipment SM02 is stored in the Equipment number 223.

A fastening torque applied when screwing of a product is performed in the Equipment SM02 such as an assembling device is stored in the fastening torque 225. In an embodiment the product corresponding to the record number "010001" indicates that the product was manufactured with a fastening torque of 0.035 N·m in the Equipment SM02.

Equipment SM0N Table

FIG. 4 is a diagram illustrating an example of the Equipment SM0N table 23.

As illustrated in FIG. 4, a record number 231, an individual ID 232, a Equipment number 233, a production ending time 234, and a fastening torque 235 are stored in the Equipment SM0N table 23 as the production data of products manufactured by the Equipment SM0N. Since the Equipment SM0N table 23 has a similar configuration to the Equipment SM01 table 21, differences will be mainly described.

Since the Equipment SM0N is a production Equipment (for example, an assembling device) in which an individual ID is appended to each of loaded products, individual IDs (for example, "Y010001" to "Y010125") of products assembled by the Equipment SM0N are stored in the individual ID 232.

The number "SM0N" of the Equipment SM0N is stored in the Equipment number 233.

A concentricity 235 is an inspection result of a product in the Equipment SM0N such as an inspection device. In an embodiment, the concentricity of a product corresponding to the record number "010001" is Ø0.35 in the Equipment SM0N.

MES System

Next, the MES system 30 will be described.

The MES system (Production Execution System) 30 is a system provided in a production plant to monitor and manage production equipment and operators in the production plant.

The MES system 30 includes a production time estimation server 40 that estimates a production time of a product manufactured in a second process (for example, the Equipment SM01) in which an individual ID is not appended to a product and a MES DB 50 that stores predetermined information used for estimating the production time.

Production Time Estimation Server

The production time estimation server 40 includes an information I/F 41, a process identifying unit 42, a training data setting unit 43, a lead time calculating unit 44, a feature amount extracting unit 45, a model creation section 46, a production time estimating unit 47, and an external storage I/F 48.

The information I/F (Interface) 41 is an interface that enables information to be exchanged with an external device and is connected to the in-plant data collection server 10 (the information I/F 11) via the information system network NT2.

The information I/F 41 receives the production data of products stored in the respective Equipment tables of the production result DB 20 via the information system network NT2.

The process identifying unit 42 identifies whether a production process (a production Equipment) provided in a production plant is a production process (a production Equipment) in which an individual ID is appended to a product or a production process (a production Equipment) in which an individual ID is not appended to a product on the basis of the production data stored in the respective Equipment tables of the production result DB 20.

The training data setting unit 43 correlates the production data (for example, a Equipment SM01 table 51 to be described later) of products manufactured by the Equipment SM01 (a second process) selected by a user with the production data (for example, a Equipment SM02 table 52 to be described later) of products manufactured by the Equipment SM02 (a first process) to create a training data table 55 (see FIG. 9) to be described later.

Here, the training data is information in which predetermined production data (for example, the Equipment number 513 and the record number 511 of the Equipment SM01 table 51) of the Equipment SM01 (a second process) in which an individual ID is not appended is correlated with predetermined production data (for example, the Equipment number 523 and the record number 521 of the Equipment SM02 table 52) of the Equipment SM02 (a first process) in which an individual ID is appended.

Due to this training data, when a defective product is manufactured in the second process in which an individual ID is not appended, the record number (the second process record number 552 of the training data table 55) of the defective product of which the individual ID is unknown can be associated with the record number (the first process record number 554 of the training data table 55) of a product manufactured in the first process in which an individual ID is appended.

The lead time calculating unit 44 calculates an inter-process lead time (LT: Lead time) of a product between respective production processes (production equipment) to create an inter-process lead time table 56 (see FIG. 10) to be described later.

Here, the inter-process lead time (LT) of a product can be defined by the following two methods.

When a production process in which an individual ID is not appended to a product and a production process in which an individual ID is appended to a product are provided in that order in order to manufacture a certain product, an inter-process lead time (LT) according to a first method is a difference between a production ending time (a production starting time) of a product A1 manufactured by the production process (a previous production process) in which an individual ID is not appended and a production ending time (a production starting time) of a product A2 manufactured from the product A1 manufactured by the production process (a subsequent production process) in which an individual ID is appended.

When a production process in which an individual ID is appended to a product and a production process in which an individual ID is not appended to a product are provided in that order in order to manufacture a certain product, an inter-process lead time (LT) according to a second method is a difference between a production ending time (a production starting time) of a product B1 manufactured by the production process (a previous production process) in which an individual ID is appended and a production ending time (a production starting time) of a product B3 subsequent to a product B2 manufactured from the product B1 manufactured by the production process (a subsequent production process) in which an individual ID is not appended.

The feature amount extracting unit 45 calculates a cycle time (CT) of a plurality of products manufactured in the past by a production process (for example, the Equipment SM02) in which an individual ID is appended and stores the inter-process lead time (LT) calculated by the lead time calculating unit 44 in a feature table 57 (see FIG. 11) to be described later.

Here, the cycle time (CT) of a product is a production time per one product in a predetermined production process (a production Equipment).

The model creation section 46 creates a production time estimation model for estimating a production time of a product manufactured in the second process (for example, the Equipment SM01) in which an individual ID is not appended on the basis of the column direction cycle time (CT) and the calculated inter-process lead time (LT).

Figure 12:
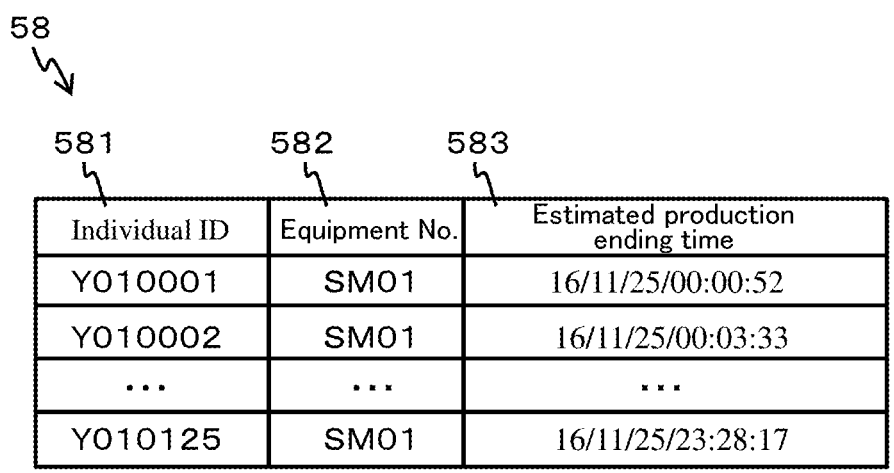
FIG. 12 is a diagram illustrating an example of a production time table.

The production time estimating unit 47 estimates a production time of a product manufactured in the second process (for example, the Equipment SM01) in which an individual ID is not appended using the calculated cycle time (CT) and the production time estimation model created by the model creation section 46 and stores the production time in the production time table 58 (see FIG. 12).

The external storage I/F (Interface) 48 is an interface that enables information to be exchanged with an external device and is connected to the MES DB 50.

MES DB

As illustrated in FIG. 1, the MES DB 50 is a database that stores information and includes a Equipment SM01 table 51, a Equipment SM02 table 52, a Equipment SM0N table 53, a process information table 54, a training data table 55, an inter-process lead time table 56, a feature table 57, and a production time table 58.

Figure 5:
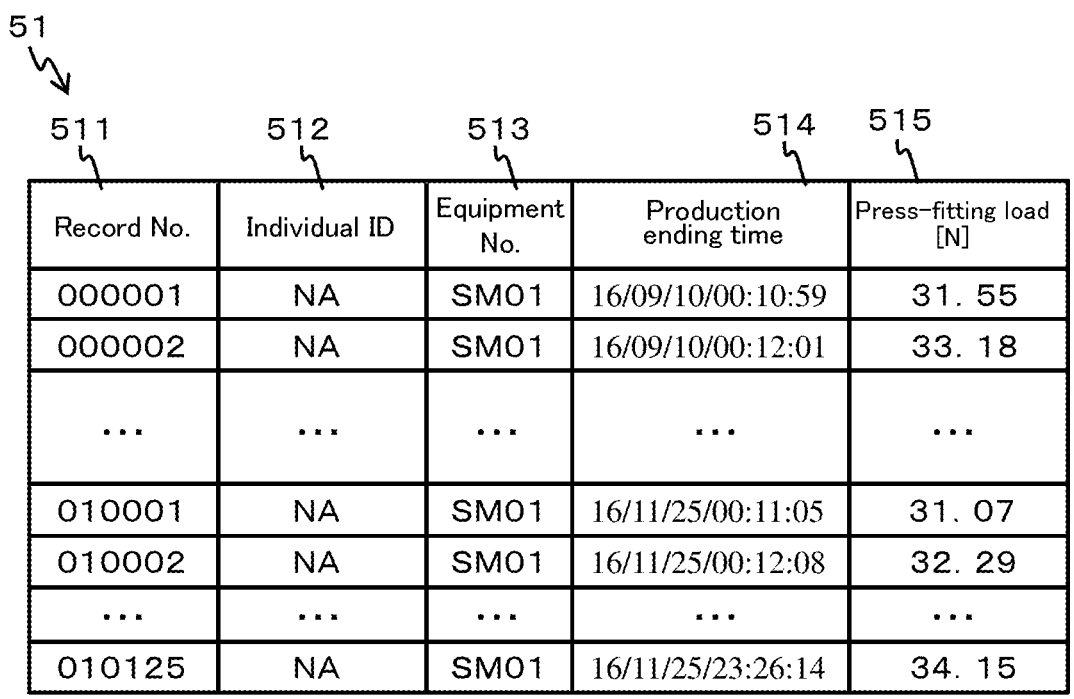
FIG. 5 is a diagram illustrating an example of a Equipment SM01 table.

Equipment SM01 Table, Equipment SM02 Table, and Equipment SM0N Table FIG. 5 is a diagram illustrating an example of the Equipment SM01 table 51.

Figure 6:
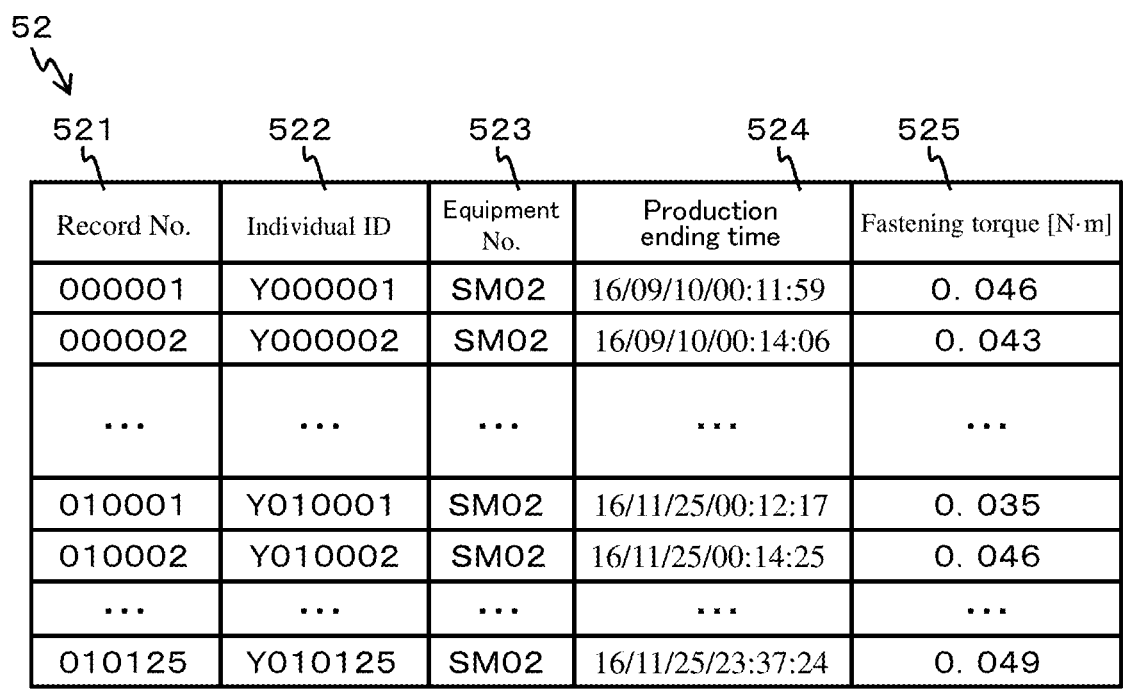
FIG. 6 is a diagram illustrating an example of a Equipment SM02 table.

FIG. 6 is a diagram illustrating an example of the Equipment SM02 table 52.

FIG. 7 is a diagram illustrating an example of the Equipment SM0N table 53.

The Equipment SM01 table 51, the Equipment SM02 table 52, and the Equipment SM0N table 53 are tables that receive respective pieces of information stored in the Equipment SM01 table 21, the Equipment SM02 table 22, and the Equipment SM0N table 23 of the production result DB 20 via the information system network NT2, respectively, and stores the information in a time-series order.

Therefore, the Equipment SM01 table 51 (see FIG. 5), the Equipment SM02 table 52 (see FIG. 6), and the Equipment SM0N table 53 (see FIG. 7) of the MES DB 50 store production data of products earlier in a time-series order than those stored in the Equipment SM01 table 21, the Equipment SM02 table 22, and the Equipment SM0N table 23 of the production result DB 20.

In an embodiment, the Equipment tables of the production result DB 20 store production data of products manufactured on and after Nov. 25, 2106, whereas the Equipment tables of the MES DB 50 store production data of products manufactured on and after Sep. 10, 2016.

Process Information Table

Figure 8:
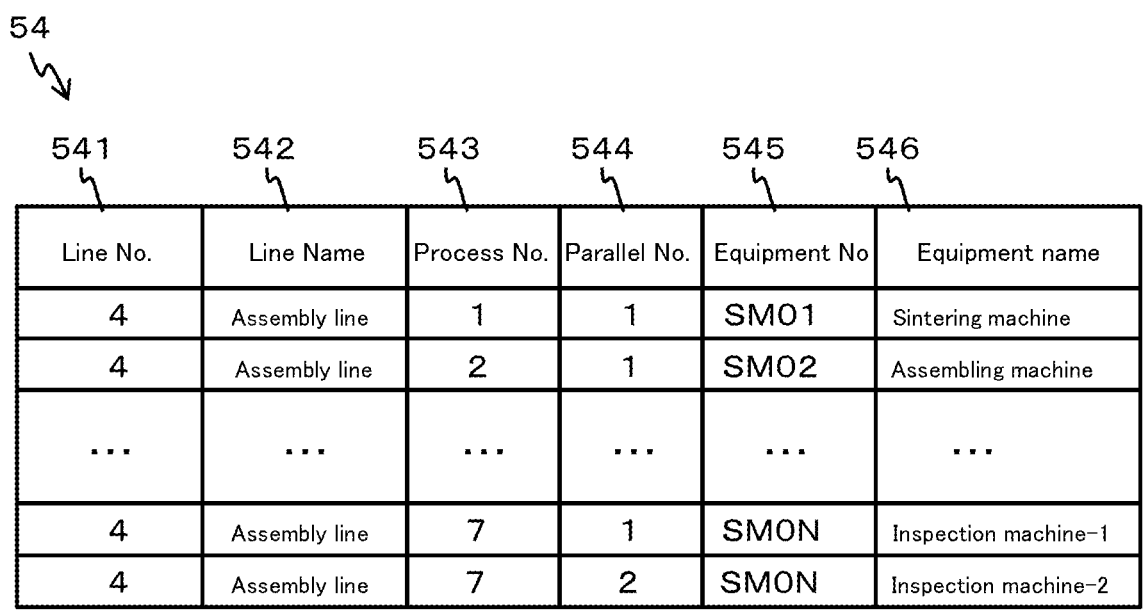
FIG. 8 is a diagram illustrating an example of a process information table.

FIG. 8 is a diagram illustrating an example of the process information table 54.

As illustrated in FIG. 8, a line number 541, a line name 542, a process number 543, a parallel number 544, a Equipment number 545, and a Equipment name 546 are stored in the process information table 54 in correlation.

The line number 541 is a line number of a production Equipment in which a product was manufactured, and in an embodiment, the line number indicates that a product was manufactured by a production Equipment of which the line number is "4".

The line name 542 is a line name of a production Equipment in which a product was manufactured, and in an embodiment, the line name indicates that a product was manufactured by a production Equipment of which the line name is an "assembly line".

The process number 543 indicates the position of a process within the assembly line. Different numbers are sequentially allocated to the process number when there are different types of processes, and the same number is allocated when there are a number of processes of the same type.

In an embodiment, since there are two inspection machines of the same type in an assembling process of the line number 4, the same number "7" is appended and stored in the process number 543.

The parallel number 544 indicates whether a production process is a series process provided in series to another process or a parallel process provided in parallel to another process in the assembly line. "1" is stored in the parallel number 544 when the production process is a series process, and "1" is stored for one of processes provided in parallel and "2" is stored for the other process when the production process is a parallel process. The parallel number 544 increases sequentially to "3", "4", and the like by the number of equipment provided in parallel.

The Equipment number 545 indicates the number of the production process. In an embodiment, any one of SM01, SM02, . . . , and SM0N is stored in the Equipment number 545.

The Equipment name 546 is the name of the production process (a production Equipment). In an embodiment, specifically, a "sintering machine" is stored as the Equipment SM01 in which an individual ID is not appended to a product. Specifically, an "assembling machine", an "inspection machine-1", and an "inspection machine-2" are stored as the equipment SM02 and SM0N in which an individual ID is appended to a product.

Training Data Table

Figure 9:
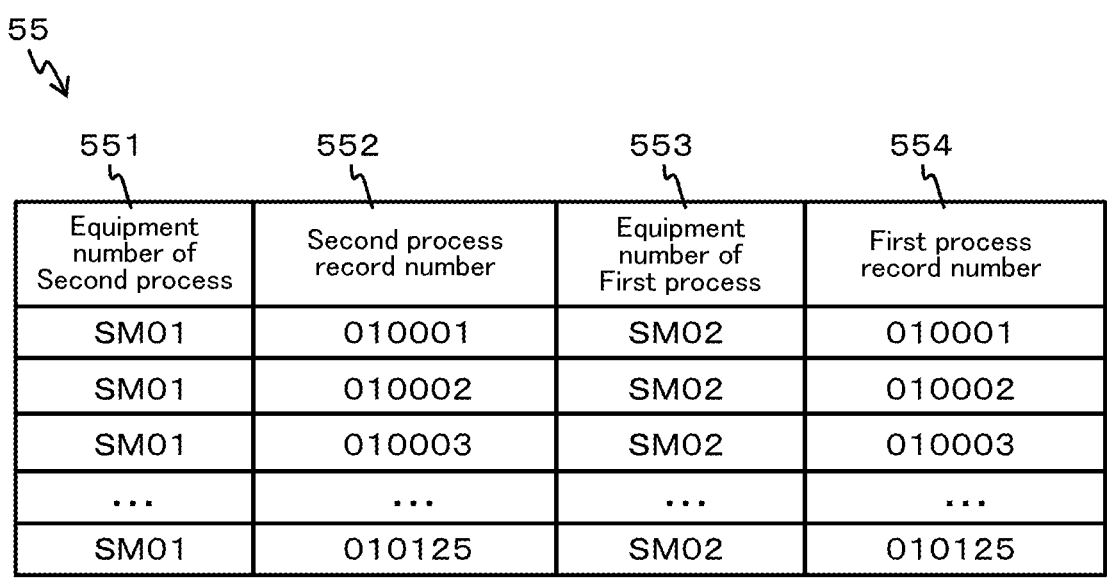
FIG. 9 is a diagram illustrating an example of a training data table.

FIG. 9 is a diagram illustrating an example of the training data table 55.

As illustrated in FIG. 9, a Equipment number of second process 551, a second process record number 552, a Equipment number of first process 553, and a first process record number 554 are stored in the training data table 55 in correlation.

In the training data table 55, the Equipment number 513 of the Equipment SM01 table 51 of the second process in which an individual ID is not appended to a product is stored as the Equipment number of second process 551, and the record number 511 of the Equipment SM01 table 51 is stored as the second process record number 552. Moreover, in the training data table 55, the Equipment number 523 of the Equipment SM02 table 52 of the first process in which an individual ID is appended to a product is stored as the Equipment number of first process 533, and the record number 521 of the Equipment SM01 table 51 is stored as the first process record number 554.

Inter-Process Lead Time Table

FIG. 10 is a diagram illustrating an example of the inter-process lead time table 56.

As illustrated in FIG. 10, the individual ID 561, the Equipment number of second process 562, the Equipment number of first process 563, and the inter-process lead time 564 are stored in the inter-process lead time table 56 in correlation.

The inter-process lead time table 56 is created on the basis of the Equipment SM01 table 51 of the second process in which an individual ID is not appended and the Equipment SM02 table 52 of the first process in which an individual ID is appended.

In the inter-process lead time table 56, a difference (for example, 672 seconds) between a production ending time 524 (for example, 00:12:17 on Nov. 25, 2016) of a product (for example, an individual ID: Y010001) of a predetermined record number 521 (for example, a record number: 010001) of the Equipment SM02 table 52 and a production ending time 514 (for example, 00:11:05 on Nov. 25, 2016) of a product (an individual ID: NA) of the record number 511 (for example, record number: 010001) of the Equipment SM01 table 51 corresponding to the record number 521 (for example, record number: 010001) is calculated and is stored in the inter-process lead time 564.

In the inter-process lead time table 56, the individual ID 522 and the Equipment number 523 of the Equipment SM02 table 52 are stored in the individual ID 561 and the Equipment number of first process 563, respectively, and the Equipment number 513 of the Equipment SM01 table 51 is stored in the Equipment number of second process 562.

Feature Table

FIG. 11 is a diagram illustrating an example of the feature table 57.

As illustrated in FIG. 11, the Equipment number of first process 571, the individual ID 572, the cycle time 573 to 575, and the inter-process lead time 576 are stored in the feature table 57 in correlation.

A plurality of (1 to M) cycle time (CT) of products manufactured in the past in the first process (for example, the Equipment SM02) in which an individual ID is appended to a product is stored in the cycle time 573 to 575.

The value of the inter-process lead time 564 of the inter-process lead time table 56 is stored in the inter-process lead time 576.

Production Time Table

FIG. 12 is a diagram illustrating an example of the production time table 58.

As illustrated in FIG. 12, the individual ID 581 identified in the second process (for example, the Equipment SM01) in which an individual ID is not appended to a product, the Equipment number 582 (SM01) of the second process, and the estimated production ending time 583 are stored in the production time table 58 in correlation.

Main Process of Production Time Estimation Server

Next, a main process executed by the production time estimation server 40 will be described.

Figure 13:
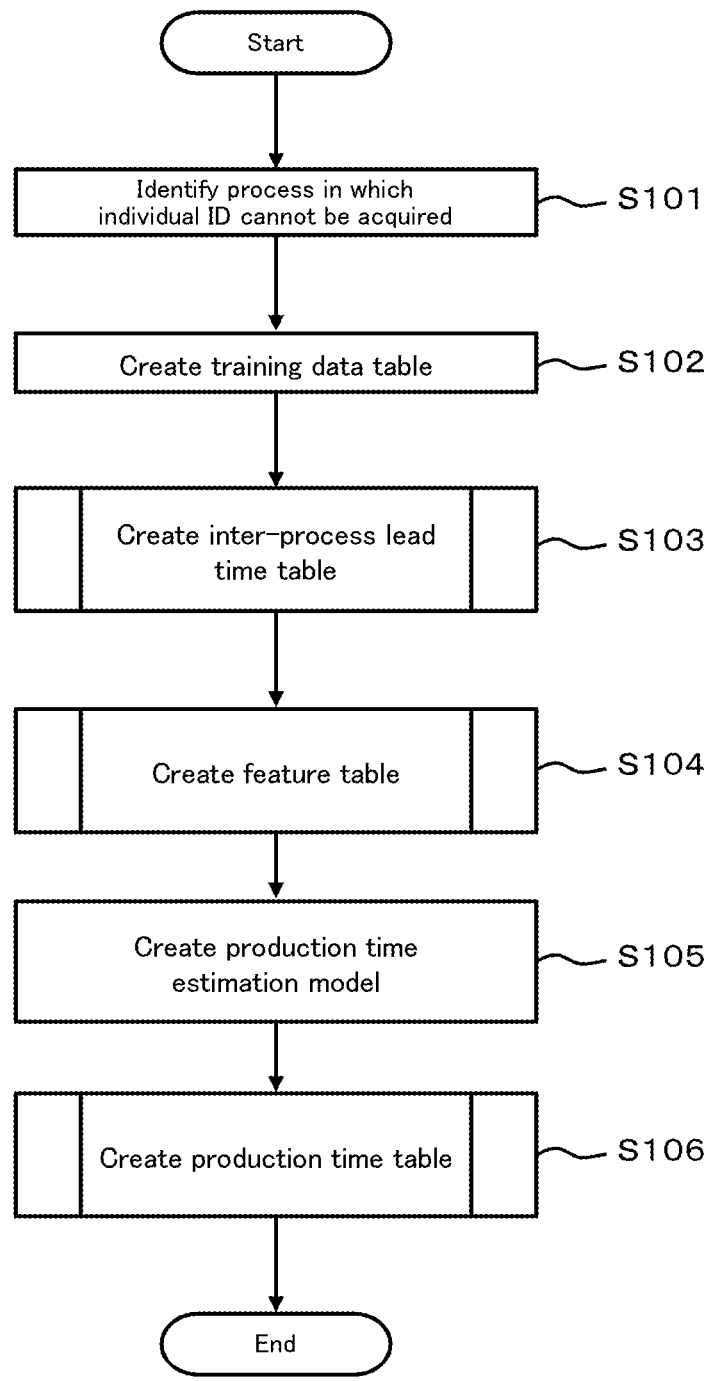
FIG. 13 is a flowchart illustrating a main process of a production time estimation server.

FIG. 13 is a flowchart illustrating a main process of the production time estimation server 40.

As illustrated in FIG. 13, in step S101, the process identifying unit 42 of the production time estimation server 40 specify process in which an individual ID cannot be acquired by referring to the individual IDs 512, 522, and 532 stored in the Equipment SM01 table 51, the Equipment SM02 table 52, and the Equipment SM0N table 53.

For example, the process identifying unit 42 identifies that the Equipment SM01 is a process (the second process) in which an individual ID is not appended by referring to the individual ID 512 of the Equipment SM01 table 51 since "NA" is stored in the individual ID 512.

On the other hand, the process identifying unit 42 identifies the equipment SM02 and SM0N are processes (the first process) in which an individual ID is appended by referring to the Equipment SM02 table 52 and the Equipment SM0N table 53 since the individual ID (for example, Y010001) is stored in the individual IDs 522 and 532 of the respective Equipment tables.

In step S102, an operator (or a microprocessor of the production time estimation server 40) sets a specific product (for example, a defective product) manufactured in the first process (for example, the Equipment SM02) in which an individual ID is appended to a product and a product corresponding to the specific product manufactured in the second process (for example, the Equipment SM01) in which an individual ID is not appended to a product.

In step S102, the training data setting unit 43 of the production time estimation server 40 extracts, for each of the set products, the Equipment number (for example, the Equipment number 513) and the record number (record number 511) of the Equipment table (for example, the Equipment SM01 table 51) of a process (for example, the second process) in which an individual ID is not appended and the Equipment number (for example, the Equipment number 523) and the record number (for example, the record number 521) of the Equipment table (for example, the Equipment SM02 table 52) of a process (for example, the first process) in which an individual ID is appended.

The training data setting unit 43 stores the extracted Equipment numbers (the Equipment numbers 513 and 523) and record numbers (the record numbers 511 and 521) in the Equipment number of second process 551, the second process record number 552, the Equipment number of first process 553, and the second process record number 554 of the training data table 55, respectively.

The training data setting unit 43 performs the above-described process with respect to all the identified products to create the training data table 55.

In step S103, the lead time calculating unit 44 of the production time estimation server 40 calculates the inter-process lead time (LT) for all the set products on the basis of the training data table 55 created in step S102 to create the inter-process lead time table 56.

The details of the inter-process lead time table creation process will be described later (see FIG. 14).

In step S104, the feature amount extracting unit 45 of the production time estimation server 40 calculates the cycle time (CT) of M+1 (for example, M=30) products manufactured in the past by a process (for example, the Equipment SM02) in which an individual ID is appended to a product to create the feature table 57.

The details of the feature table creation process will be described later (see FIG. 15).

In step S105, the model creation section 46 of the production time estimation server 40 creates a production time estimation model for estimating the inter-process lead time (LT) of a product from the cycle time 573 to 575 of M+1 (for example, M=30) products manufactured in the past on the basis of the feature table 57 by a method such as machine learning.

Here, a known learning algorithm such as multiple regression analysis is used for the machine learning.

In step S106, the production time estimating unit 47 of the production time estimation server 40 estimates the production ending times of products manufactured by a process (for example, the Equipment SM01) in which an individual ID is not appended to a product on the basis of the cycle time 573 to 575 of M+1 (for example, M=30) products manufactured in the past, the production time estimation model created by the model creation section 46, the production ending time (for example, the production ending time 524) correlated with the individual ID (for example, the individual ID 522) stored in the Equipment table (the Equipment SM02 table 52) of a process (for example, the Equipment SM02) in which an individual ID is appended to a product by referring to the feature table 57, creates the production time table 58, and ends the process. The details of the production time table creation process will be described later (see FIG. 16).

Inter-Process Lead Time Table Creation Process

Next, an inter-process lead time table creation process of step S103 will be described in detail.

Figure 14:
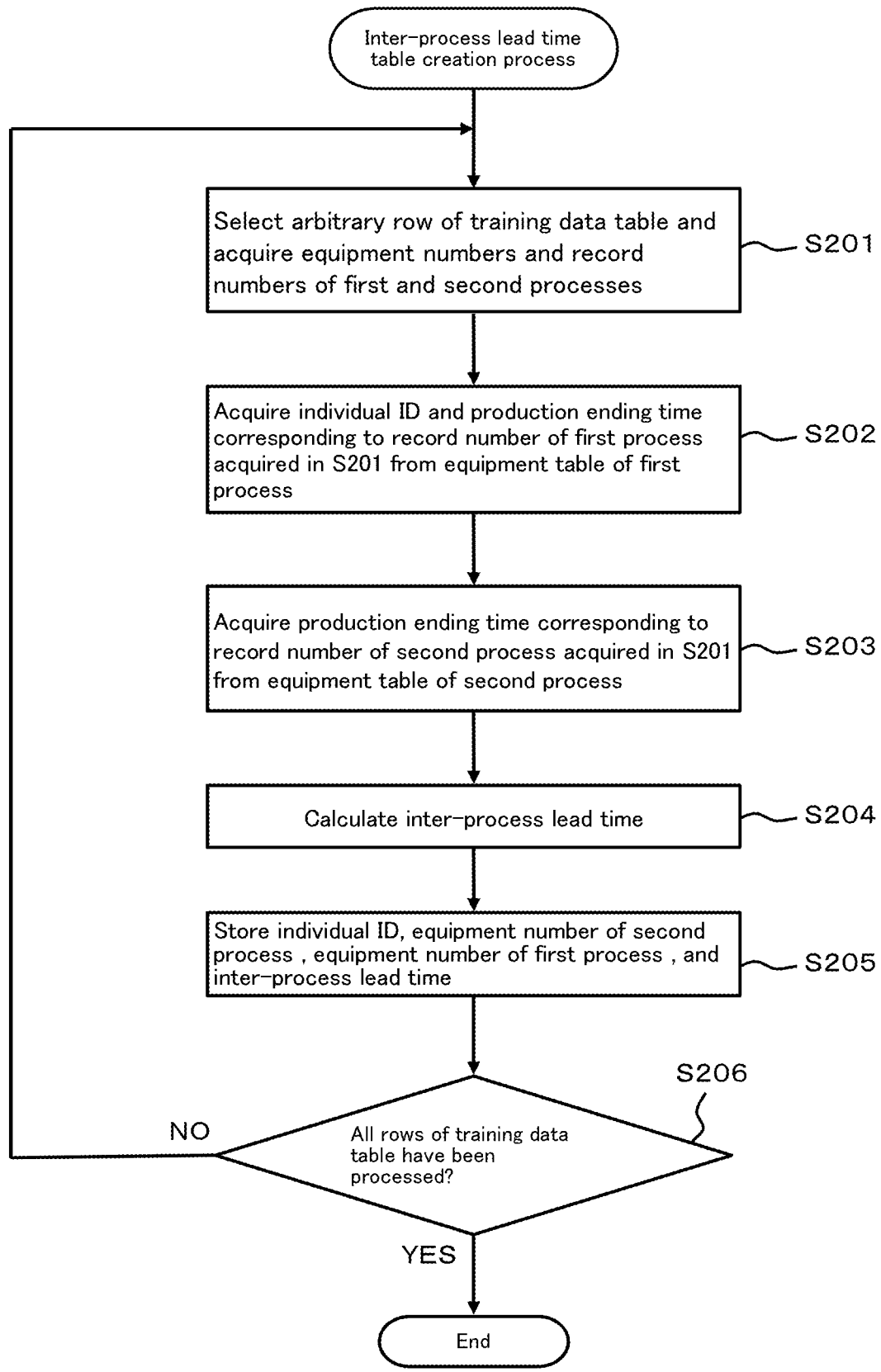
FIG. 14 is a flowchart illustrating an inter-process lead time table creation process.

FIG. 14 is a flowchart of an inter-process lead time table creation process.

In step S201, the lead time calculating unit 44 of the production time estimation server 40 selects an arbitrary row from the training data table 55 (see FIG. 9) created in step S102 and acquires the Equipment number of second process 551, the second process record number 552, the Equipment number of first process 553, and the first process record number 554.

For example, the lead time calculating unit 44 selects the first row of the training data table 55 to acquire "SM01" for the Equipment number of second process 551, "010001" for the second process record number, "SM02" for the Equipment number of first process 553, and "010001" for the first process record number.

In step S202, the lead time calculating unit 44 acquires the individual ID 522 and the production ending time 524 identified by the first process record number 554 acquired in step S201 from the Equipment table (for example, the Equipment SM02 table 52) of the first process (for example, the Equipment SM02) in which an individual ID is appended to a product.

For example, the lead time calculating unit 44 acquires the individual ID "Y010001" and the production ending time "00:12:17 on Nov. 25, 2016" identified by the first process record number "010001" acquired in step S201 by referring to the Equipment SM02 table 52.

In step S203, the lead time calculating unit 44 acquires the production ending time 514 identified by the second process record number 552 acquired in step S201 from the Equipment table (for example, the Equipment SM01 table 51) of the second process (for example, the Equipment SM01) in which an individual ID is not appended to a product.

For example, the lead time calculating unit 44 acquires the production ending time "00:11:05 on Nov. 25, 2016" identified by the second process record number "010001" acquired in step S201 by referring to the Equipment SM01 table 51.

In step S204, the lead time calculating unit 44 calculates a difference between the production ending time 524 of a predetermined record number 521 in the Equipment SM02 table 52 of the first process acquired in step S202 and the production ending time 514 of a predetermined record number 511 in the Equipment SM01 table 51 of the second process acquired in step S203 to calculate the inter-process lead time (LT).

For example, the lead time calculating unit 44 calculates a difference between the production ending time "00:12:17 on Nov. 25, 2016" of the record number "010001" of the first process acquired in step S202 and the production ending time "00:11:05 on Nov. 25, 2016" of the record number "010001" of the second process acquired in step S203 to calculate the inter-process lead time "672 seconds".

In step S205, the lead time calculating unit 44 stores the individual ID "Y010001" of the first process acquired in step S202 and the inter-process lead time "672 seconds" acquired in step S204 in the individual ID 561, the Equipment number of second process 562, the Equipment number of first process 563, and the inter-process lead time 564 of the inter-process lead time table 56 in correlation with the Equipment number of second process "SM01" and the Equipment number of first process "SM02", respectively.

In step S206, the lead time calculating unit 44 determines whether the processes of steps S201 to S205 have been performed for all rows of the training data table 55 (see FIG. 9).

When it is determined that the processes of steps S201 to S205 have been performed for all rows of the training data table 55 (step S206: YES), the lead time calculating unit 44 ends the inter-process lead time table creation process. When it is determined that the processes have not been performed for all rows (step S206: NO), the lead time calculating unit 44 returns to the process of step S201, performs the processes of steps S201 to S205 until it is determined that the processes have been performed for all rows in the training data table 55 (see FIG. 9), and creates the inter-process lead time table 56.

Feature Table Creation Process

Next, the feature table creation process of step S104 will be described in detail.

Figure 15:
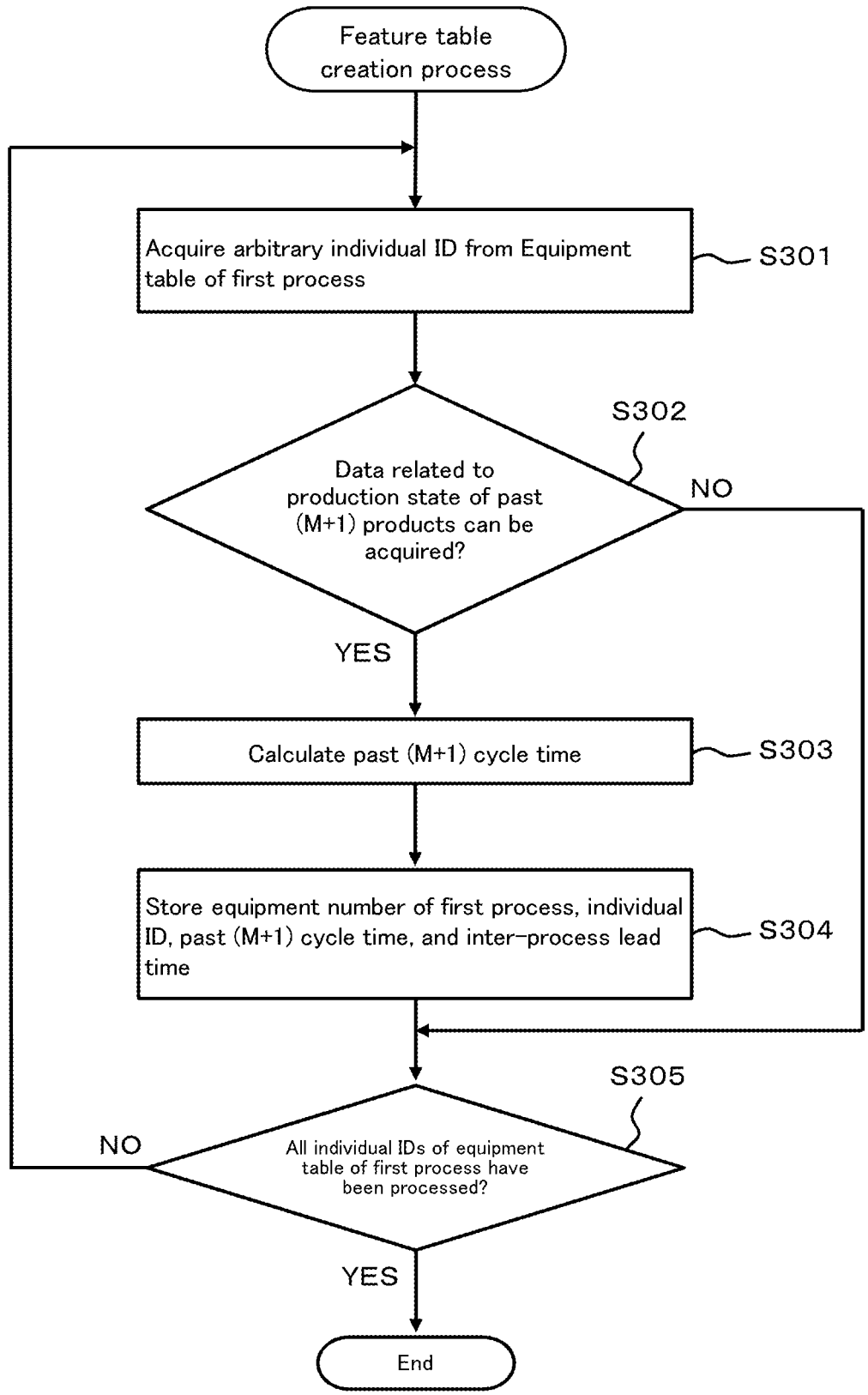
FIG. 15 is a flowchart illustrating a feature table creation process.

FIG. 15 is a flowchart of the feature table creation process. In an embodiment, a case of acquiring the cycle time (CT) of M+1 (for example, M=30) products manufactured in the past in the first process (for example, the Equipment SM02) will be described.

In step S301, the feature amount extracting unit 45 of the production time estimation server 40 acquires an arbitrary individual ID 522 (for example, Y010001 of the first row) in which the present process has not been performed from the Equipment table (the Equipment SM02 table 52) of the first process (the Equipment SM02) in which an individual ID is appended to a product.

In step S302, the feature amount extracting unit 45 determines whether it is possible to acquire production data of M+1 (for example, 31) products manufactured earlier than a product to which the individual ID "Y010001" acquired in step S301 is appended by referring to the Equipment table (the Equipment SM02 table 52) of the first process (the Equipment SM02).

Here, when the number of products manufactured in the past is equal to or smaller than M+1 (31), the feature amount extracting unit 45 determines that it is not possible to acquire the production data (step S302: NO) and proceeds to step S305 since it is not possible to acquire the cycle time (CT) of M+1 (31) products. That is, when the individual ID 522 of the Equipment SM02 table 52 is equal to or larger than Y010030, the feature amount extracting unit 45 determines for the first time that it is possible to acquire production data (step S302: YES) and proceeds to step S303, and creation of the feature table 57 starts.

In step S303, when it is determined that it is possible to acquire the production data of M+1 products manufactured in the past (step S302: YES), the feature amount extracting unit 45 calculates the cycle time (CT) of M+1 products manufactured in the past in the first process (the Equipment SM02).

In step S304, the feature amount extracting unit 45 stores the Equipment number of first process "SM02", the individual IDs 522 "Y010030 to Y010125" acquired in step S301, the cycle time 1 to 30 of M+1 products manufactured in the past calculated in step S303 in the Equipment number of first process 571, the individual ID 572, and the cycle time 573 to 575 of the feature table 57 by referring to the Equipment table (the Equipment SM02 table 52) of the first process (the Equipment SM02).

Moreover, the feature amount extracting unit 45 extracts the inter-process lead time 564 correlated with the acquired individual ID from the inter-process lead time table 56 (see FIG. 10) created in step S103 and stores the inter-process lead time 564 in the inter-process lead time 576 correlated with the corresponding individual ID.

In step S305, the feature amount extracting unit 45 determines whether the processes of steps S301 to S304 have been performed for all individual IDs 522 of the Equipment table (the Equipment SM02 table 52) of the first process (the Equipment SM02).

When it is determined that the above-described process has been performed for all individual IDs 522 (step S305: YES), the feature amount extracting unit 45 ends the present process. When it is determined that the above-described process has not been performed for all individual IDs 522 (step S305: NO), the feature amount extracting unit 45 returns to step S301 to repeatedly perform the processes of steps S301 to S304 until it is determined that the above-described process has been performed for all individual IDs 522 to create the feature table 57.

When it is determined in step S302 that it is not possible to acquire the production data of M+1 products manufactured in the past in the first process (the Equipment SM02) (step S305: NO), the feature amount extracting unit 45 proceeds to step S305 and determines whether the processes of steps S301 to S304 have been performed for all individual IDs 522 stored in the Equipment table of the first process.

When it is determined that the above-described process has been performed for all individual IDs 522 (step S305: YES), the feature amount extracting unit 45 ends the present process. When it is determined that the above-described process has not been performed for all individual IDs 522 (step S305: NO), the feature amount extracting unit 45 returns to step S301 to repeatedly perform the processes of steps S301 to S304 until it is determined that the above-described process has been performed for all individual IDs 522.

Production time Table Creation Process Next, the production time table creation process of step S106 will be described in detail.

Figure 16:
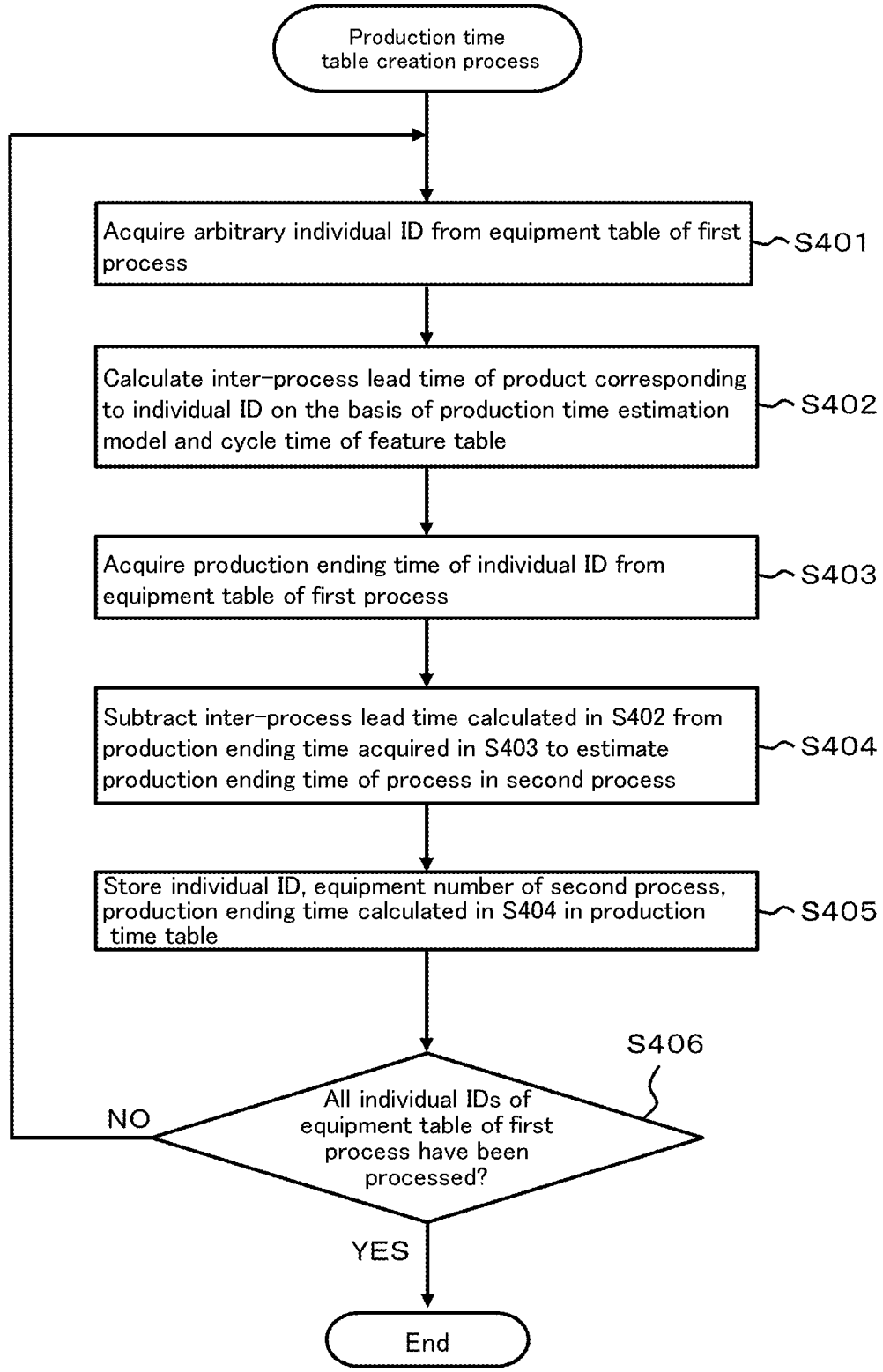
FIG. 16 is a flowchart illustrating a production time table creation process.

FIG. 16 is a flowchart of the production time table creation process.

In step S401, the production time estimating unit 47 of the production time estimation server 40 acquires an arbitrary individual ID 522 (for example, Y010001 of the first row) by referring to the Equipment table (for example, the Equipment SM02 table 52) of the first process (for example, the Equipment SM02) in which an individual ID is appended to a product.

In step S402, the production time estimating unit 47 calculates an inter-process lead time (for example, 685 seconds) of the individual ID "Y010001" on the basis of the production time estimation model created in step S105 and the cycle time 573 to 575 of the feature table 57 created in step S104.

In step S403, the production time estimating unit 47 acquires the production ending time 524 (00:12:17 on Nov. 25, 2016) of the individual ID 522 "Y010001" in the first process by referring to the Equipment table (for example, the Equipment SM02 table 52) of the first process (for example, the Equipment SM02).

In step S404, the production time estimating unit 47 subtracts the inter-process lead time (for example, 685 seconds) calculated in step S402 from the production ending time 524 "00:12:17 on Nov. 25, 2016" of the individual ID 522 "Y010001" of the first process (the Equipment SM02) acquired in step S403 to extract the production ending time of a product corresponding to the individual ID in the second process (for example, the Equipment SM01) in which an individual ID is not appended to a product.

For example, the production ending time of the product corresponding to the individual ID of the second process is "00:00:52 on Nov. 25, 2016" obtained by subtracting 685 seconds (11 minutes, 25 seconds) from 00:12:17 on Nov. 25, 2016.

In step S405, the production time estimating unit 47 stores an arbitrary individual ID 522 "Y010001" acquired in step S401, the Equipment number "SM01" of the second process, and the production ending time "0 clock, 0 minute, 52 seconds on Nov. 25, 2016" calculated in step S404 in the individual ID 581, the Equipment number 582, and the estimated production ending time 583 of the production time table 58.

In step S406, the production time estimating unit 47 determines whether the processes of steps S401 to S405 have been performed for all individual IDs 522 of the Equipment table (the Equipment SM02 table) of the first process (the Equipment SM02).

When it is determined that the processes of steps S401 to S405 have been performed for all individual IDs 522 (step S406: YES), the production time estimating unit 47 ends the present process. When it is determined that the processes of steps S401 to S405 have not been performed for all individual IDs 522 (step S406: NO), the production time estimating unit 47 repeatedly performs the processes of steps S401 to S405 until the present process is finished for all individual IDs 522 to create the production time table 58.

Training Data Creation Screen

Next, an example of an operation when creating the training data table 55 will be described. In an embodiment, when the training data table 55 is created, a training data creation screen 70 is displayed on a monitor 60 so that an operator can perform operations while watching the training data creation screen 70.

Figure 17:
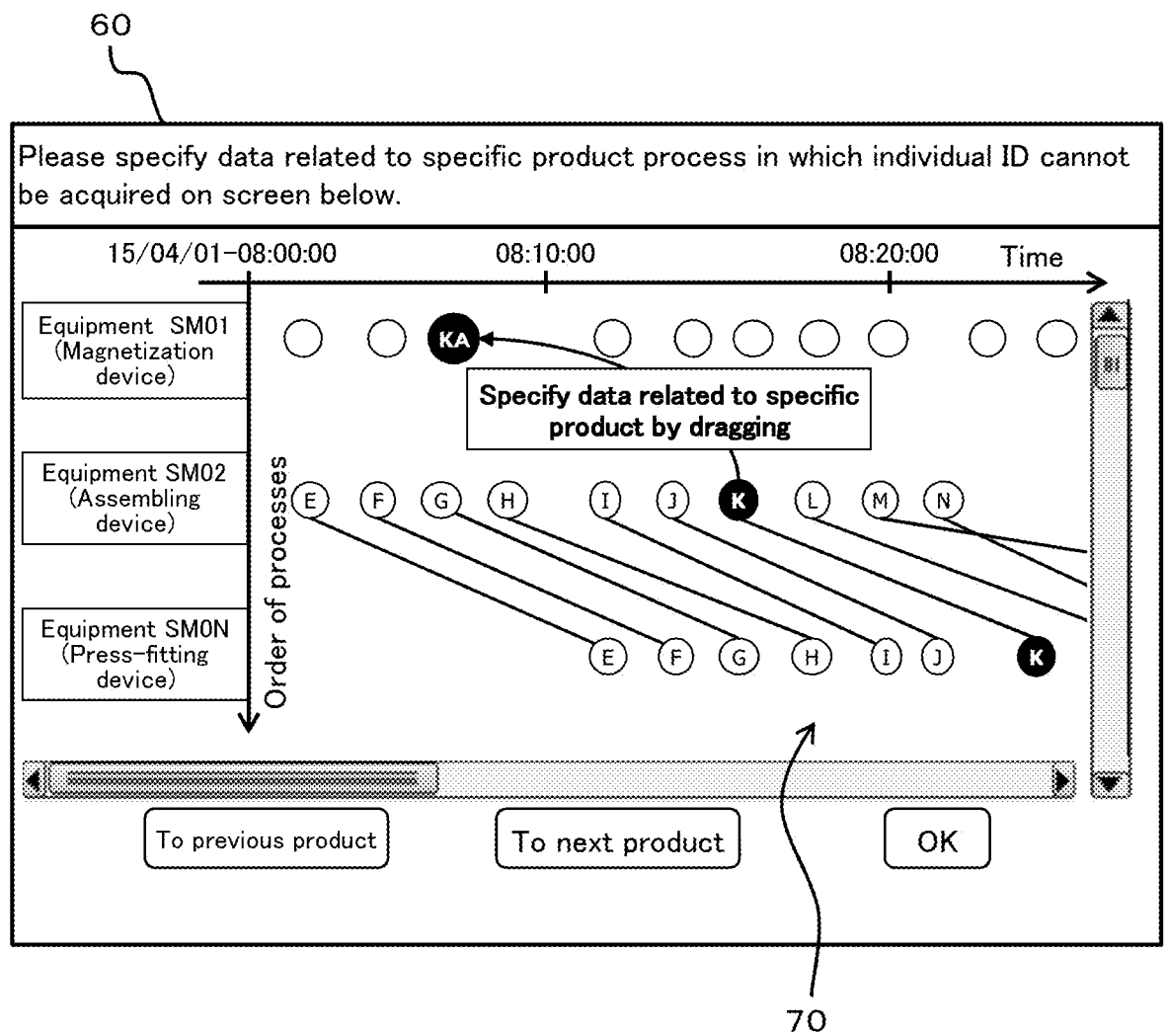
FIG. 17 is a schematic diagram illustrating an example of a training data creation screen.

FIG. 17 is a schematic diagram illustrating an example of the training data creation screen 70.

In the training data creation screen 70 displayed on the monitor 60, a vertical axis is the order of processes and a horizontal axis is a time axis.

As illustrated in FIG. 17, in an embodiment, a Equipment SM01 (a magnetizing device) in which an individual ID is not appended to a product and a Equipment SM02 (an assembling device) and a Equipment SM0N (a press-fitting device) in which an individual ID is appended to a product are displayed in that order on the vertical axis.

Since an individual ID is not appended to a product manufactured by the Equipment SM01, a production ending time of a product manufactured by the Equipment SM01 is displayed as a circle or the like (see an upper part of the screen).

Since an individual ID is appended to a product manufactured by the Equipment SM02, an alphabet (an individual ID) is appended to a production ending time of a product manufactured by the Equipment SM02, for example, so that the respective individual IDs can be identified (see a middle part of the screen).

Since an individual ID is appended to a product manufactured by the Equipment SM0N, an alphabet (an individual ID) is appended to a production ending time of a product manufactured by the Equipment SM0N, for example, so that the respective individual IDs can be identified (see a lower part of the screen).

Here, for example, when a defect occurs in a product K (a product to which an individual ID is appended) manufactured by the Equipment SM02, an operator (or a microprocessor of the production time estimation server 40; hereinafter referred to as an operator or the like) identifies, in the training data creation screen 70, a production time of a product (circle) manufactured by the Equipment SM01, corresponding to the product K manufactured by the Equipment SM02 by referring to the production data of the Equipment SM01 table 51 and the Equipment SM02 table 52.

Specifically, an operator or the like specify the product K manufactured by the Equipment SM02 and a product KA manufactured by the SM01 identified from the product K.

In this way, the training data setting unit 43 extracts the Equipment number (the Equipment number of first process: SM02) and the record number (the first process record number: 010001) correlated with the product K manufactured by the Equipment SM02 from the Equipment SM02 table 52 and extracts the Equipment number (the Equipment number of second process: SM01) and the record number (the second process record number: 010001) correlated with the product KA manufactured by the Equipment SM01 from the Equipment SM02 table 52.

The training data setting unit 43 stores the Equipment number "SM02" and the record number "010001" correlated with the product K and the Equipment number "SM01" and the record number "010001" correlated with the product KA in the Equipment number of first process 553, the first process record number 554, the Equipment number of second process 551, and the second process record number 552 of the training data table 55, respectively.

The operator or the like performs the above-described operations with respect to all defective products manufactured by the first step to identify a product manufactured in the second process. As a result, the training data setting unit 43 creates the training data table 55 in which the Equipment numbers and the record numbers of all these products are stored in the training data table 55.

As described above, the embodiment can be summarized as below.

(1) The traceability system 1 that estimates a production time of a product manufactured by a predetermined production device, the product being manufactured sequentially by a plurality of production devices and identifies production data of the product manufactured by the predetermined production device, the system including:

the Equipment SM02 table 52 (a first production table) that stores the record number 221, the individual ID 222, the Equipment number 223, the production ending time 224, and the press-fitting load 225 (production data) of products manufactured by the Equipment SM02 (a first production device) in which an individual ID (a unique identification number) is appended to the product among the plurality of production devices;

the Equipment SM01 table 51 (a second production table) that stores the record number 211, the individual ID 212, the Equipment number 213, the production ending time 214, and the press-fitting load 215 (production data) of products manufactured by the Equipment SM01 (a second production device) in which an individual ID (a unique identification number) is not appended to the product among the plurality of production devices;

the training data setting unit 43 that creates a training data table 55 that stores the Equipment number 213 and the record number 511 (the production data) of the Equipment SM01 table 51 and the Equipment number 523 and the record number 521 (the production data) of the Equipment SM02 table 52 in correlation;

the feature amount extracting unit 45 (a production time calculating unit) that calculates the cycle time (CT) for each of a predetermined number of (for example, 30) products manufactured in the past by the Equipment SM02 (the first production device) on the basis of the Equipment SM02 table 52;

the model creation section 46 that creates a production time estimation model for estimating a production time of the product manufactured by the Equipment SM01; and the production time estimating unit 47 that estimates the production time of the product manufactured by the Equipment SM01 from the cycle time (CT) per one product and the production time estimation model.

With this configuration, in the traceability system 1, the production time of the product manufactured by the Equipment SM01 in which an individual ID is not appended is estimated on the basis of the production time estimation model and the cycle time (CT) of the product manufactured by the Equipment SM02 in which an individual ID is appended.

Therefore, in the traceability system 1, as compared to a case in which the production time of a product manufactured by a main process in which an individual ID is not appended is calculated from the cycle time (CT) of a product and the number of products manufactured only, since the production time is estimated on the basis of the production time estimation model, it is possible to estimate the production time of the product manufactured by the Equipment SM01 in which an individual ID is not appended more reliably.

(2) The production time estimating unit 47 acquires the individual ID 522 of the product manufactured by the Equipment SM02 in which an individual ID is appended and calculates an inter-process lead time (an inter-process production time) of a predetermined product between the Equipment SM02 and the Equipment SM01 in the individual ID of the product on the basis of the production time estimation model and the cycle time (CT) per one product, and the production time estimating unit 47 acquires the production ending time 524 of the product manufactured by the Equipment SM02 from the Equipment SM02 table 52, calculates a difference between the production ending time 524 and the inter-process lead time (LT), and estimates the production ending time of the product manufactured by the Equipment SM01 in which an individual ID is not appended.

With this configuration, in the traceability system 1, the inter-process lead time (LT) of the product is estimated on the basis of the cycle time (CT) and the production time estimation model.

Therefore, as compared to a case of calculating the production ending time of the product manufactured by the Equipment SM01 in which an individual ID is not appended from the cycle time (CT) and the number of products manufactured only, the traceability system 1 can estimate the production ending time of the product manufactured by the Equipment SM01 more reliably on the basis of the cycle time (CT) and the estimated inter-process lead time (LT).

(3) The model creation section 46 has a learning algorithm (for example, machine learning such as multiple regression analysis), and the learning algorithm creates the production time estimation model for estimating the production ending time of the product manufactured by the Equipment SM01 in which an individual ID is not appended on the basis of the cycle time (CT) per one product and the inter-process lead time (LT).

With this configuration, it is possible to estimate the production ending time of the product manufactured by the Equipment SM01 using a known learning algorithm (for example, machine learning such as multiple regression analysis) and reduce the costs and labor for creating a new learning algorithm.

(4) The production time estimating unit 47 compares the production ending time of the product manufactured by the Equipment SM01, estimated by the production time estimating unit 47 and the actual production ending time of the product manufactured by the Equipment SM01, stored in the Equipment SM01 table 51 and correlates an individual ID appended to the product manufactured by the Equipment SM02 with the production ending time of the product manufactured by the Equipment SM01.

With this configuration, it is possible to append an individual ID of the product manufactured by the Equipment SM02 to a product of which the production ending time is closer to the estimated production ending time among the products manufactured by the Equipment SM01 in which an individual ID is not appended and identify an individual ID of the product manufactured by the Equipment SM01. Moreover, by comparing the production ending time of the product manufactured by the Equipment SM01 estimated by the above-described method with the actual production ending time in the Equipment SM01, a product of which the production ending time is closest to the estimated production ending time is identified. As a result, it is possible to identify the production data of the product manufactured by the Equipment SM01.

(5) The traceability system 1 further includes the monitor 60 (a display device) that displays the production ending time of the product manufactured by the Equipment SM02 in which an individual ID is appended and the production ending time of the product manufactured by the Equipment SM01 in which an individual ID is not appended, and when the product manufactured by the Equipment SM02 and the product manufactured by the Equipment SM01 are selected, the monitor 60 displays the Equipment number of first process 553 and the first process record number 554 (the production data) of the product manufactured by the Equipment SM02 and the Equipment number of second process 551 and the second process record number 552 (the production data) of the product manufactured by the Equipment SM01 in correlation.

With this configuration, when an operator creates a training data table, the operator can correlate the production data of the product manufactured by the Equipment SM01 with the production data of the product manufactured by the Equipment SM02 by selecting a product manufactured by the Equipment SM01 in which an individual ID is not appended and a product manufactured by the Equipment SM02 in which an individual ID is appended while watching the monitor 60. Therefore, it is possible to improve operability.

Second Embodiment

Next, a traceability system 1A according to a second embodiment of the present invention will be described.

The traceability system 1A according to the second embodiment is different from the traceability system 1 of the first embodiment in that the production ending time of a product manufactured by a Equipment in which an individual ID is not appended is estimated by taking the number of partially finished products between respective processes into consideration.

Components similar to those of the traceability system 1 of the first embodiment will be denoted by the same reference numerals in the drawings and the description thereof will be provided as necessary.

FIG. 18 is a diagram illustrating an example of a training data table 55A according to the second embodiment.

As illustrated in FIG. 18, in the training data table 55A, the number of partially finished products 555 between respective processes is stored in correlation with the Equipment number of second process 551, the second process record number 552, the Equipment number of first process 553, and the first process record number 554.

FIG. 19 is a diagram illustrating an example of a feature table 57A according to the second embodiment.

As illustrated in FIG. 19, in the feature table 57A, the number of partially finished products 577 between respective processes is stored in correlation with the Equipment number of first process 571, the individual ID 572, the cycle time 573 to 575, and the inter-process lead time 576.

Main Process of Production Time Estimation Server

Next, a main process of a production time estimation server according to the second embodiment will be described.

Figure 20:
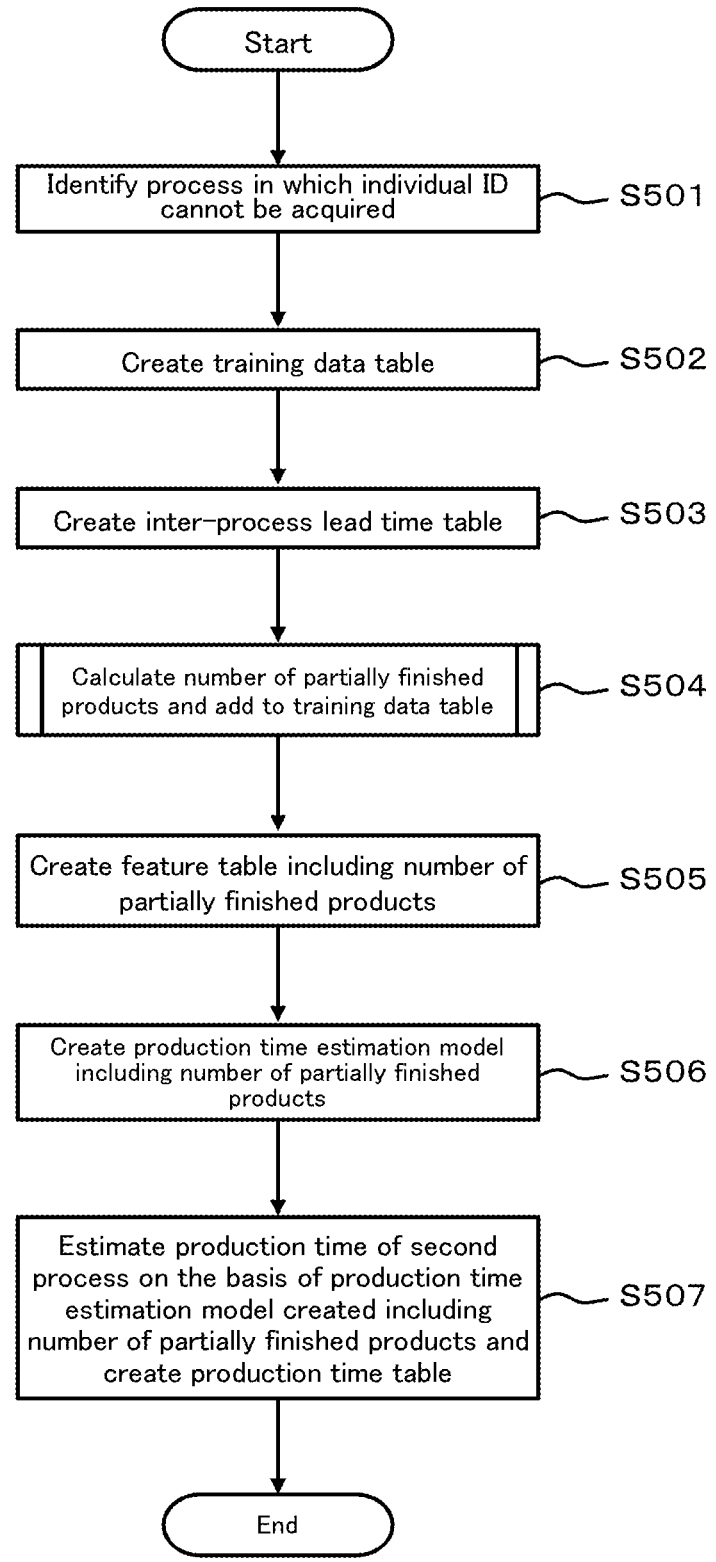
FIG. 20 is a flowchart illustrating a main process of a production time estimation server according to the second embodiment.

FIG. 20 is a flowchart of a main process of a production time estimation server according to the second embodiment.

In the main process of the second embodiment, since the processes of steps S501 to S503 are the same as the processes of steps S101 to S103 of the main process of the production time estimation server according to the first embodiment, the detailed description thereof will be omitted.

In step S504, the training data setting unit 43 of the production time estimation server 40 calculates the number of partially finished products, adds the calculated number to a number-of-inter-process partially finished products 555 of the training data table 55 to create a training data table 55A in which the number of partially finished products is also stored (see FIG. 18).

The details of a method of calculating the number of partially finished products in the training data setting unit 43 will be described later (see FIG. 21).

In step S505, the feature amount extracting unit 45 of the production time estimation server 40 acquires the number of partially finished products calculated in step S504 from the training data table 55A and adds the acquired number to the number-of-inter-process partially finished products 577 of the feature table 57 to create a feature table 57A (see FIG. 19) in which the number of partially finished products is also stored.

In step S506, the model creation section 46 of the production time estimation server 40 creates a production time estimation model for estimating the inter-process lead time (LT) of products by a method such as machine learning on the basis of the cycle time 573 to 575 of M+1 (for example, M=30) products manufactured in the past and the calculated number of partially finished products 577 by referring to the feature table 57A.

Here, a known learning algorithm such as multiple regression analysis is used for the machine learning.

In step S507, the production time estimating unit 47 of the production time estimation server 40 estimates a production ending time of a product in the second process (the Equipment SM01) in which an individual ID is not appended on the basis of the cycle time 573 to 575 of M+1 (for example, M=30) products manufactured in the past, the number of partially finished products 577, the production time estimation model created by the model creation section 46, and the production ending times of respective individual IDs stored in the Equipment SM02 table 52 (the Equipment SM0N table 53) of the first process in which an individual ID is appended by referring to the feature table 57A to create the production time table 58 and ends the process.

Number-of-Inter-Process Partially-Finished-Products Calculation Process

Next, a number-of-inter-process partially-finished-products calculation process will be described.

Figure 21:
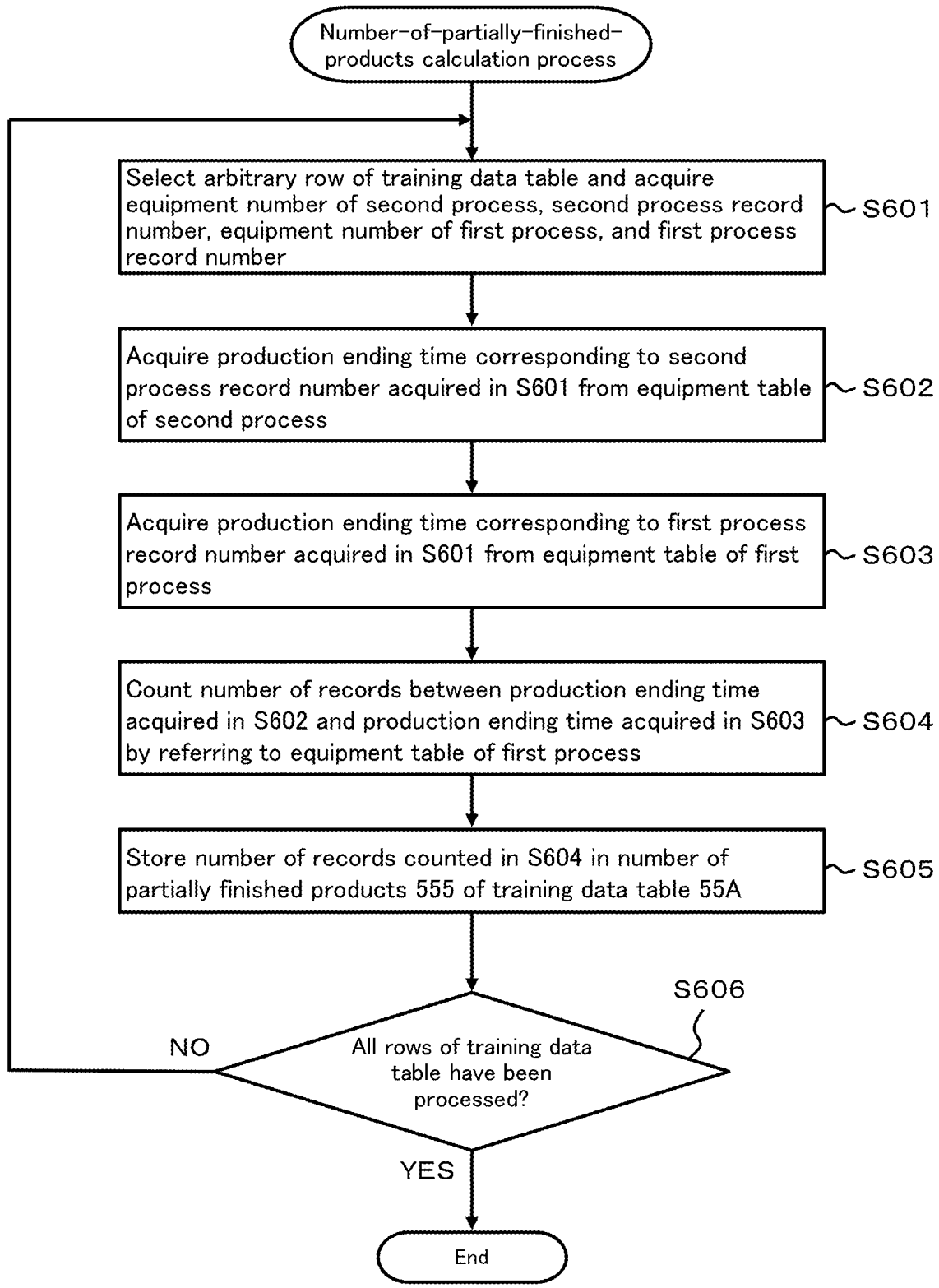
FIG. 21 is a flowchart illustrating a process of calculating the number of inter-process partially finished products.

FIG. 21 is a flowchart illustrating a process of calculating the number of inter-process partially finished products.

The number-of-inter-process partially-finished-product calculation process is a process performed by the training data setting unit 43 of the production time estimation server 40.

In step S601, the training data setting unit 43 of the production time estimation server 40 selects an arbitrary row of the training data table 55 of the MES DB 50 and acquires the Equipment number of second process 551, the second process record number 552, the Equipment number of first process 553, and the first process record number 554.

In step S602, the training data setting unit 43 refers to a Equipment table (for example, the Equipment SM01 table 51) of the second process (for example, the Equipment SM01) acquired in step S601. Moreover, the training data setting unit 43 acquires the production ending time of the second process record number 552 (for example, 010001) of the arbitrary row acquired in step S601 from the Equipment table.

In step S603, the training data setting unit 43 refers to a Equipment table (for example, the Equipment SM02 table 52) of the first process (for example, the Equipment SM02) acquired in step S601. Moreover, the training data setting unit 43 acquires the production ending time of the first process record number 554 (for example, 010017) of the arbitrary row acquired in step S601 from the Equipment table.

In step S604, the training data setting unit 43 counts the number of records (rows) between the production ending time acquired in step S602 and the production ending time acquired in step S603 by referring to the Equipment table (for example, the Equipment SM02 table 52) of the first process.

In step S605, the training data setting unit 43 stores the number counted in step S604 as the number of partially finished products 555 in the selected row of the training data table 55A to create the training data table 55A in which the number of partially finished products 555 is also included.

In step S606, the training data setting unit 43 determines whether the processes of steps S601 to S605 have been performed for all rows of the training data table 55 and ends the process when it is determined that the processes have been finished for all rows (step S606: YES).

In step S606, when it is determined that the processes have not been finished for all rows of the training data table 55 (step S606: NO), the training data setting unit 43 returns to step S601 to repeatedly perform the processes of steps S601 to S605 until it is determined that the process has been finished for all rows of the training data table 55.

In this way, in the traceability system 1A according to the second embodiment, the model creation section 46 can create the production time estimation model by machine learning such as multiple regression analysis using the number of partially finished products 577 in addition to the cycle time 573 to 575 of M products created in the past as a weight function.

Therefore, by adding the element of the number of partially finished products 577 to the function of machine learning, since the number of weight functions used when performing multiple regression analysis, for example, is increased by one, it is possible to create the production time estimation model with higher accuracy than the production time estimation model created by the model creation section 46 of the traceability system 1 according to the first embodiment on the basis of the cycle time 573 to 575 of M products created in the past only.

Training Data Creation Screen

Next, a training data creation screen 70A according to the second embodiment will be described.

Figure 22:
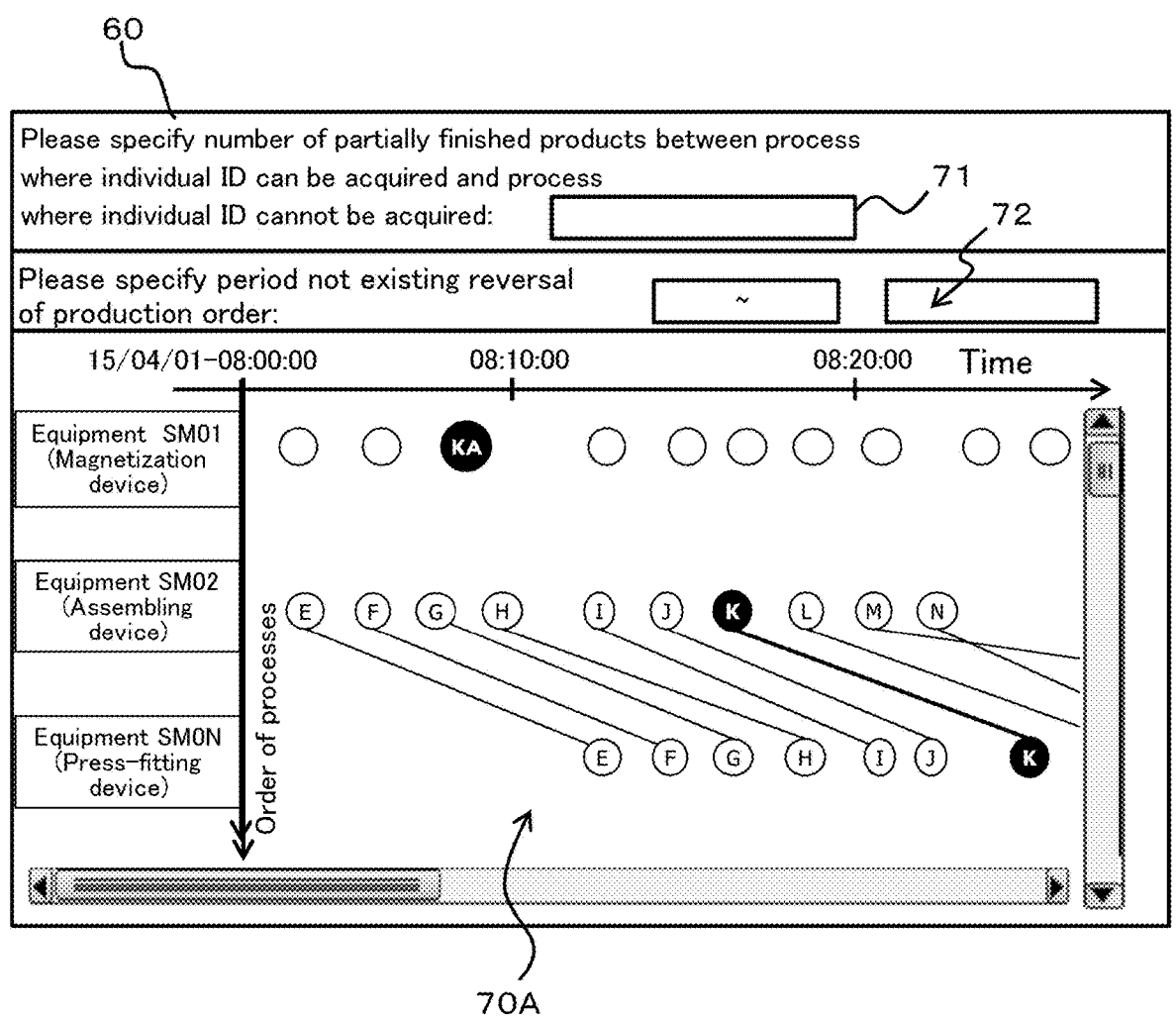
FIG. 22 is a schematic diagram illustrating an example of a training data creation screen according to the second embodiment.

FIG. 22 is a schematic diagram illustrating an example of the training data creation screen 70A according to the second embodiment.

As illustrated in FIG. 22, an input portion 71 for inputting the number of partially finished products between the first process (for example, the Equipment SM02) in which an individual ID can be acquired and the second process (for example, the Equipment SM01) in which an individual ID cannot be acquired is provided in the training data creation screen 70A displayed on the monitor 60.

An operator inputs the number of partially finished products in the input portion 71 and specify a specific product K (for example, a defective product) in the Equipment SM02 and a product KA of the Equipment SM01 estimated to correspond to the specific product K. By doing so, in the main process of the production time estimation server 40, the processes of steps S501 to S507 are performed, and the production ending time of the product KA corresponding to the specified product K in the second process in which an individual ID cannot be acquired is estimated.

In an embodiment, an input portion 72 for specifying a period not existing reversal of production order is also provided on the training data creation screen 70A, and by inputting a period not existing reversal of production order in the input portion 72, it is possible to estimate the production ending time of the product KA with higher accuracy.

As described above, the second embodiment can be summarized as below.

(6) The model creation section 46 creates the production time estimation model on the basis of the cycle time (CT) per one of a plurality of products and the number of products (the number of partially finished products) being manufactured between the Equipment SM02 in which an individual ID is appended and the Equipment SM01 in which an individual ID is not appended.

When there are a large number of partially finished products between the Equipment SM01 in which an individual ID is not appended and the Equipment SM02 in which an individual ID is appended, it may be difficult to accurately estimate the production ending time of a product manufactured by the Equipment SM01 due to a variation in the production ending times corresponding to the number of partially finished products.

With this configuration, since the model creation section 46 creates the production time estimation model by taking the number of partially finished products into consideration, the production time estimating unit 47 can estimate the production ending time accurately on the basis of the production time estimation model which takes the number of partially finished products also into consideration.

In the embodiment, although a case in which individual IDs for identifying individual products are appended has been illustrated, the traceability system 1 or 1A can be applied when the product is parts managed as a lot rather than identifying respective products such as screw parts, for example.

Figure 23:
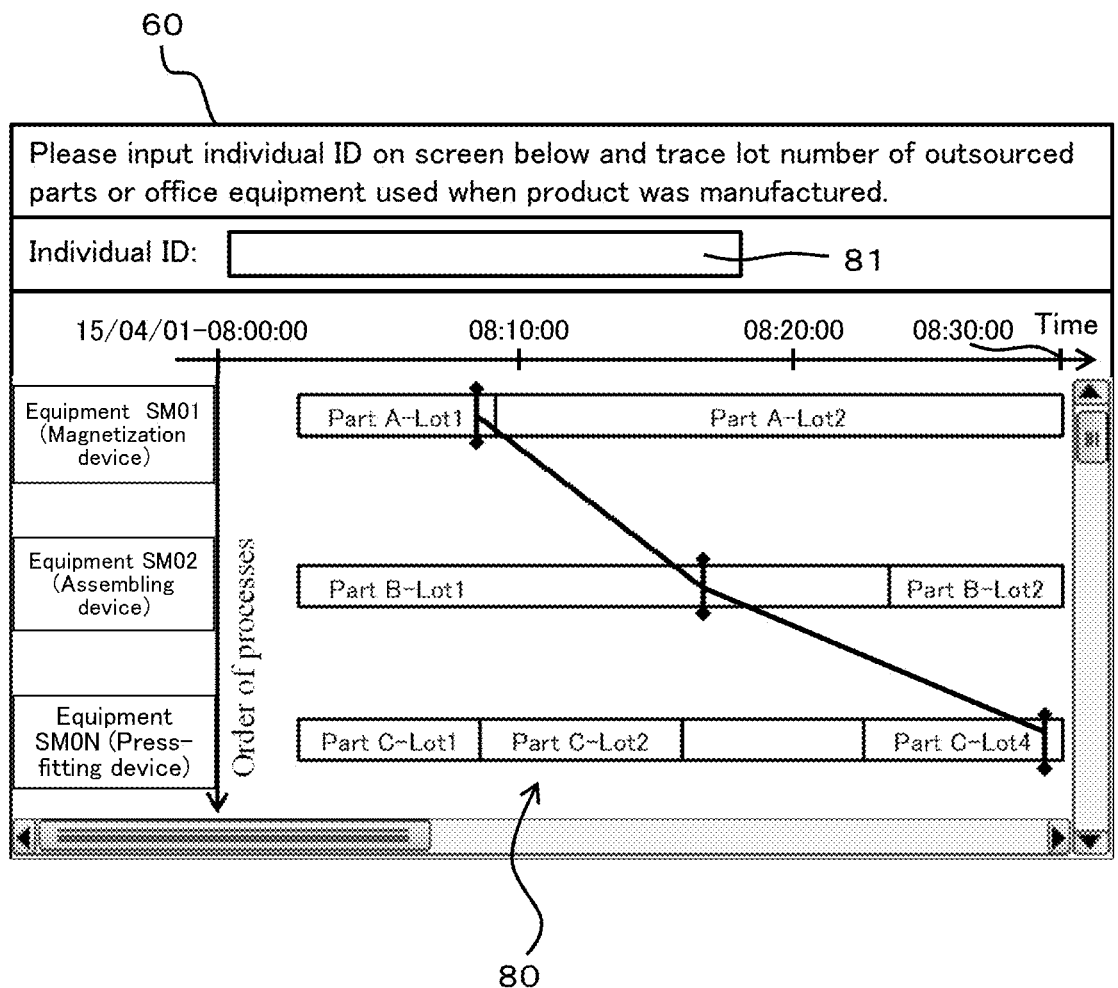
FIG. 23 is a schematic diagram illustrating an example of a display screen for a traceability result.

FIG. 23 is a diagram illustrating an example of a display screen for a traceability result.

As illustrated in FIG. 23, when the traceability system 1 or 1A estimates the production ending time of office equipment or an outsourced part such as a screw part, a traceability result display screen 80 as illustrated in FIG. 23 is displayed on the monitor 60.

An individual ID input portion 81 for inputting an individual ID of a manufactured product is provided in the traceability result display screen 80. When an individual ID of a manufactured product is input to the individual ID input portion 81, the use period of parts A, B, and C (for example, screw parts) used in respective equipment of a product to which the individual ID is appended is displayed together with a lot.

Here, the use period of the parts A, B, and C means a use period of a part used when a predetermined product was manufactured.

For example, in the Equipment SM01, a lot 1 of the part A is used in the period from 08:02 on Apr. 1, 2015 to 08:09, and a lot 2 of the part A is used in the period from 08:09 to 08:30. In the Equipment SM02, a lot 1 of the part B is used in the period from 08:02 to 08:23, and a lot 2 of the part B is used in the period from 08:23 to 08:30.

In the Equipment SM0N, a lot 1 of the part C is used in the period from 08:02 to 08:09, a lot 2 of the part C is used in the period from 08:09 to 08:16, a lot 3 of the part C is used in the period from 08:16 to 08:22, and a lot 4 of the part C is used in the period from 08:22 to 08:30.

As illustrated in FIG. 23, with the traceability system 1 or 1A, it is understood that the lot 1 of the part Bused in a predetermined period of the Equipment SM02 (an inspection device) is used in the lot 4 of the part C used in a predetermined period of the Equipment SM0N (a press-fitting device).

Moreover, it is understood that the lot 1 of the part A used in a predetermined period of the Equipment SM01 (a magnetization device) is used in the lot 1 of the part B used in a predetermined period of the Equipment SM02 (a press-fitting device).

In this way, even if parts are managed by lots, which lot of which part was used by which Equipment can be ascertained on the traceability result display screen 80.

As a result, when a defective product occurs in the lot 4 of the part C used in a predetermined period of the Equipment SM0N, for example, an operator can ascertain the use periods in respective equipment, of the parts A, B, and C used for production a product to which an individual ID is appended by inputting the individual ID of a product manufactured to the individual ID input portion 81 on the traceability result display screen 80.

Due to the traceability result display screen 80, the operator can identify that the lot 1 of the part Bused in a predetermined period of the Equipment SM02 was used in the lot 4 of the part C. Furthermore, it is possible to identify that the lot 1 of the part A used in a predetermined period of the Equipment SM01 was used in the lot 1 of the part B used in a predetermined period of the Equipment SM02.

A difference between the estimated production ending time of a product manufactured by a Equipment (for example, the Equipment SM01) in which an individual ID is not appended and the actual production ending time of the product manufactured by a Equipment (the Equipment SM01) in which an individual ID is not appended may be calculated, and a product having the production ending time of which the difference is the smallest may be identified as the product.

Figure 24:
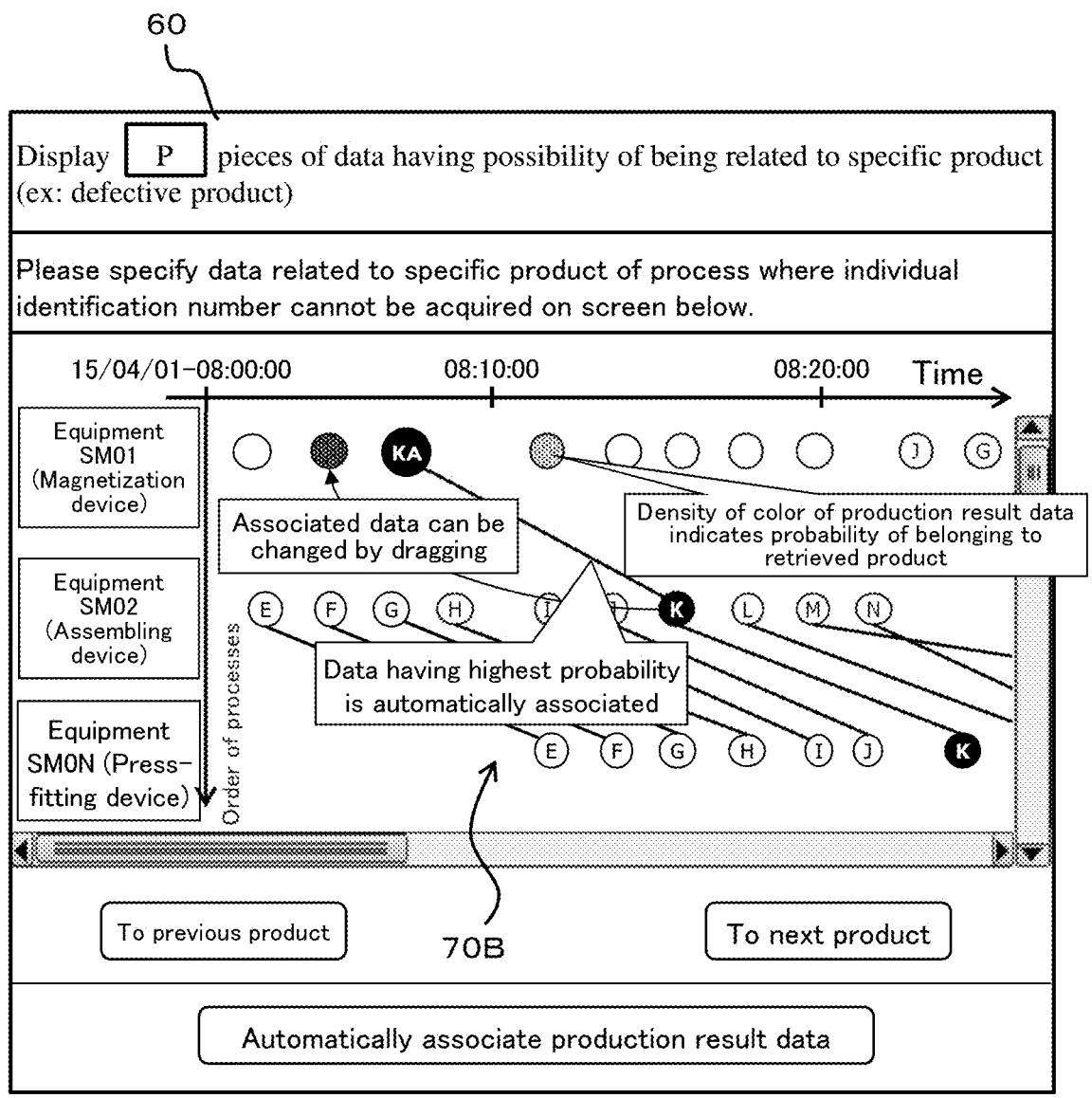
FIG. 24 is a schematic diagram illustrating an example of a training data creation screen according to another embodiment.

FIG. 24 is a schematic diagram illustrating an example of a training data creation screen 70B.

In the training data creation screen 70B, the Equipment SM02 and the product K to which an individual ID is appended and which was manufactured by the Equipment SM0N are associated.

When the production ending time in the Equipment SM01 in which an individual ID of the product K is not appended is estimated by the traceability system 1 or 1A, the production time estimation server 40 compares the estimated production ending time of the product K with the production ending time of a product actually manufactured by the Equipment SM01 by referring to the Equipment SM01 table 51.

As a result, the production time estimation server 40 identifies that a product having the production ending time of which the difference between the production ending time in the Equipment SM01 of the product estimated by the production time estimation server 40 and the production ending time in the Equipment SM01 of the product manufactured actually is the smallest is the product KA corresponding to the product K.

Moreover, the smaller the difference, the higher the possibility of the product being the product KA corresponding to the product K, and the larger the difference, the lower the possibility of the product being the product KA corresponding to the product K so that the magnitude of possibility can be ascertained by the density of color on the training data creation screen 70B.

For example, the smaller the difference, the thicker the displayed color in a circle corresponding to the product manufactured by the Equipment SM01, and the larger the difference, the lighter the displayed color in the circle, so that the magnitude of possibility of the product being the product KA corresponding to the product K can be ascertained immediately.

Although the product KA having the highest possibility (the smallest difference) is associated with the product K in the training data creation screen 70B, an operator (or a microprocessor provided in the production time estimation server 40) may select another product actually manufactured by the Equipment SM01.

In this way, it is possible to identify the product KA manufactured by the Equipment SM01 corresponding to the product K manufactured by the Equipment SM02 more reliably on the basis of the rule of thumb of the operator (or a microprocessor provided in the production time estimation server 40).

What is claimed is:

1. A traceability system that estimates a production time at which a product has been manufactured by a predetermined production device, the product being manufactured sequentially by a plurality of production devices, and that identifies production data of the product manufactured by the predetermined production device on the basis of the estimated production time,
the system comprising:
a first production table configured to store production data of products manufactured by a first production device, in which a unique identification number is appended to the product, among the plurality of production devices;
a second production table configured to store production data of products manufactured by a second production device, in which a unique identification number is not appended to the product, among the plurality of production devices;
a training data setting unit configured to create a training data table that stores the production data of the first production table and the production data of the second production table, which are correlated with each other;
a production time calculating unit configured to calculate a production time for each of a predetermined number of products manufactured in the past by the first production device on the basis of the first production table;
a model creation section configured to create a production time estimation model for estimating a production time at which the product has been manufactured by the second production device; and
a production time estimating unit configured to estimate the production time at which the product has been manufactured by the second production device from the production time per one product and the production time estimation model.

2. The traceability system according to claim 1, wherein the production time estimating unit acquires a unique identification number of the product manufactured by the first production device and calculates an inter-process production time required to manufacture a predetermined product between the first production device and the second production device in the unique identification number of the product on the basis of the production time per one product and the production time estimation model, and
the production time estimating unit acquires the production time at which the product has been manufactured by the first production device from the first production table, calculates a difference between the production time and the inter-process production time, and estimates the production time of the product manufactured by the second production device.

3. The traceability system according to claim 1, wherein the model creation section has a learning algorithm, and the learning algorithm creates a production time estimation model for estimating a production time at which a product has been manufactured by the second production device on the basis of the production time per one product and the inter-process production time of the product.

4. The traceability system according to claim 3, wherein the model creation section creates the production time estimation model on the basis of the production time per one product and the number of products being manufactured between the first production device and the second production device.

5. The traceability system according to claim 4, wherein the production time estimating unit compares the production time at which the product has been manufactured by the second production device, estimated by the production time estimating unit and the production time at which the product has been manufactured by the second production device, stored in the second production table and correlates a unique identification number appended to the product manufactured by the first production device with the production time at which the product has been manufactured by the second production device.

6. The traceability system according to claim 5, wherein the product is a part used for production a product in the first production device or the second production device, and the production time estimating unit estimates a use period of the part used for production the product in the second production device.

7. The traceability system according to claim 6, further comprising:

a display device configured to display the production time at which the product has been manufactured by the first production device and the production time at which the product has been manufactured by the second production device, wherein when the product manufactured by the first production device and the product manufactured by the second production device are selected, in the display device, production data of the product manufactured by the first production device and production data of the product manufactured by the second production device are correlated with each other.

8. A method for traceability for estimating a production time at which a product has been manufactured by a predetermined production device, the product being manufactured sequentially by a plurality of production devices, and identifying production data of the product manufactured by the predetermined production device on the basis of the estimated production time, the method comprising:

creating a first production table that stores production data of a product manufactured by a first production device, in which a unique identification number is appended to the product, among the plurality of production devices;

creating a second production table that stores production data of a product manufactured by a second production device, in which a unique identification number is not appended to the product, among the plurality of production devices;

creating a training data table that stores the production data of the first production table and the production data of the second production table, which are correlated with each other;

calculating a production time for each of a predetermined number of products manufactured in the past by the first production device on the basis of the first production table and creating a production time table that stores the production time;

creating a production time estimation model for estimating a production time at which the product has been manufactured by the second production device; and estimating the production time at which the product has been manufactured by the second production device from the production time per one product and the production time estimation model.

9. The method for traceability according to claim 8, wherein the estimating of the production time includes:

acquiring a unique identification number of the product manufactured by the first production device;

calculating an inter-process production time required to produce a predetermined product between the first production device and the second production device in the unique identification number of the product on the basis of the production time per one product from among the plurality of products and the production time estimation model; and acquiring the production time at which the product has been manufactured by the first production device from the first production table, obtaining a difference between the production time and the inter-process production time, and estimating the production time of the product manufactured by the second production device.

10. The method for traceability according to claim 9, wherein the creating of the production time estimation model includes:

creating the production time estimation model on the basis of the production time per one product, the inter-process production time of the product, and the number of products being manufactured between the first production device and the second production device.

11. The method for traceability according to claim 10, wherein the estimating of the production time includes:

comparing the production time at which the product has been manufactured by the second production device, estimated by the production time estimating unit and the production time at which the product has been manufactured by the second production device, stored in the second production table, and correlating a unique identification number appended to the product manufactured by the first production device with the production time at which the product has been manufactured by the second production device.

* * * * *